United States Patent
Chen et al.

(10) Patent No.: US 9,577,638 B2
(45) Date of Patent: Feb. 21, 2017

(54) DIGITAL SIGNAL UP-CONVERTING APPARATUS AND RELATED DIGITAL SIGNAL UP-CONVERTING METHOD

(71) Applicant: MEDIATEK INC., Hsin-Chu (TW)

(72) Inventors: Yang-Chuan Chen, Chiayi County (TW); Chi-Hsueh Wang, Kaohsiung (TW); Hsiang-Hui Chang, Miaoli County (TW); Bo-Yu Lin, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/273,547

(22) Filed: May 9, 2014

(65) Prior Publication Data
US 2014/0348279 A1 Nov. 27, 2014

Related U.S. Application Data

(60) Provisional application No. 61/825,630, filed on May 21, 2013.

(51) Int. Cl.
*H04L 7/00* (2006.01)
*H03K 19/0175* (2006.01)
(Continued)

(52) U.S. Cl.
CPC ..... *H03K 19/017509* (2013.01); *G01R 21/06* (2013.01); *G01R 23/00* (2013.01);
(Continued)

(58) Field of Classification Search
CPC ...... H03K 3/012; H03K 3/017; H03K 5/1565; H03K 7/08; H04L 7/00; H04L 25/02;
(Continued)

(56) References Cited

U.S. PATENT DOCUMENTS 6,738,420 B1 * 5/2004 Bradley ............. H03H 17/0219
375/219
8,781,025 B2 * 7/2014 Rofougaran .................. 375/297
(Continued)

OTHER PUBLICATIONS

D. Brandon, "The Advantage of Using Quadrature Digital Upconverter (QDUC) in Point-to-point Microwave Transmit Systems", 2009.*
(Continued)

*Primary Examiner* — Shawkat M Ali
(74) *Attorney, Agent, or Firm* — Wolf, Greenfield & Sacks, P.C.

(57) ABSTRACT

A digital signal up-converting apparatus includes: a clock generating circuit arranged to generate a reference clock signal; an adjusting circuit coupled to the clock generating circuit and arranged to generate a first clock signal and a second clock signal according to the reference clock signal; a baseband circuit coupled to the adjusting circuit for receiving the first clock signal, wherein the baseband circuit further generates a digital output signal according to the first clock signal; and a sampling circuit coupled to the adjusting circuit and the baseband circuit for receiving the second clock signal and the digital output signal, wherein the second clock signal and the digital output signal are non-overlapping; wherein the sampling circuit samples the digital output signal based on the second clock signal and then combines the sampled digital output signal in order to generate a combined digital signal.

9 Claims, 14 Drawing Sheets

(51) Int. Cl.

| | | |
|---|---|---|
| *H03F 3/217* | (2006.01) | |
| *H04L 27/34* | (2006.01) | |
| *H04B 1/04* | (2006.01) | |
| *H04W 24/02* | (2009.01) | |
| *H04L 25/02* | (2006.01) | |
| *H04L 25/08* | (2006.01) | |
| *H03M 1/12* | (2006.01) | |
| *G01R 21/06* | (2006.01) | |
| *G01R 23/00* | (2006.01) | |
| *H03F 1/24* | (2006.01) | |
| *H04L 27/20* | (2006.01) | |

(52) U.S. Cl.
CPC ............ *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC ......... H04L 27/00; H04L 27/04; H04L 27/06; H04L 27/14; H04L 7/0037; H04L 7/0091
USPC .......... 323/271; 327/91, 144, 156, 172, 175, 327/291; 375/219, 238, 295–297, 316, 375/354–355; 713/322, 503
See application file for complete search history.

(56) References Cited

U.S. PATENT DOCUMENTS

| | | | | |
|---|---|---|---|---|
| 2004/0196926 | A1* | 10/2004 | Chien et al. | 375/316 |
| 2005/0123029 | A1* | 6/2005 | Vorenkamp | H04L 5/06 375/222 |
| 2005/0143032 | A1* | 6/2005 | Matsushita | H04B 1/30 455/232.1 |
| 2009/0135897 | A1* | 5/2009 | Soma et al. | 375/238 |
| 2009/0140248 | A1* | 6/2009 | Ma | 257/48 |
| 2009/0253398 | A1* | 10/2009 | Sheehy | H03C 3/0933 455/313 |
| 2010/0027711 | A1* | 2/2010 | Manku | H03M 1/68 375/295 |
| 2010/0117649 | A1* | 5/2010 | Nakanishi et al. | 324/318 |
| 2010/0135368 | A1* | 6/2010 | Mehta | H04L 27/38 375/219 |
| 2010/0183093 | A1* | 7/2010 | Ghannouchi | H03F 3/217 375/302 |
| 2010/0272213 | A1* | 10/2010 | Wurm | H04B 1/0053 375/295 |
| 2012/0128092 | A1 | 5/2012 | Lai | |
| 2013/0057239 | A1* | 3/2013 | Kalje et al. | 323/271 |
| 2013/0241757 | A1* | 9/2013 | Morris | H03D 7/161 341/144 |
| 2013/0259158 | A1* | 10/2013 | Zarei | H04L 25/03 375/296 |

OTHER PUBLICATIONS

Analog Devices: CMOS 200 MHz Quadrature Digital Upconverter, 2005.*
Robert Bogdan Staszewski, IEEE Journal of Solid-State Circuits, All-Digital PLL and Transmitter for Mobile Phones, Dec. 2005, 2469-2482, vol. 40, No. 12.
Albert Jerng, IEEE Journal of Solid-State Circuits, A Wideband Delta-Sigma Digital-RF Modulator for High Data Rate Transmitters, Aug. 2007, 1710-1722, vol. 42, No. 8.
Petri Eloranta, IEEE Journal of Solid-State Circuits, A Multimode Transmitter in 0.13 um CMOS Using Direct-Digital RF Modulator, Dec. 2007, 2774-2784, vol. 42, No. 12.
Andras Pozsgay, IEEE International Solid-State Circuits Conference, A Fully Digital 65nm CMOS Transmitter for the 2.4-to-2.7GHz WiFi/WiMAX Bands using 5.4GHz Delta-Sigma RF DACs, 2008, pp. 360-361 & Figure 20.3.7, Session 20 / WLAN/WPAN / 20.3, Feb. 5, 2008.
Shouhei Kousai, IEEE International Solid-State Circuits Conference, An Octave-Range Watt-Level Fully Integrated CMOS Switching Power Mixer Array for Linearization and Back-Off Efficiency Improvement, 2009, pp. 376-377 & Figure 22.2.7, Session 22 / PA and Antenna Interface / 22.2, Feb. 11, 2009.
Jaimin Mehta, IEEE International Solid-State Circuits Conference, A 0.8mm2 All-Digital SAW-Less Polar Transmitter in 65nm EDGE SoC, 2010, pp. 58-59 & Figure 3.2.7, Session 3 / Cellular Techniques / 3.2, Feb. 8, 2010.

* cited by examiner

DIGITAL SIGNAL UP-CONVERTING APPARATUS AND RELATED DIGITAL SIGNAL UP-CONVERTING METHOD

CROSS REFERENCE TO RELATED APPLICATIONS

This application claims the benefit of U.S. Provisional Application No. 61/825,630, which was filed on 2013 May 21 and is included herein by reference.

BACKGROUND

The present invention relates to a digital signal up-converting apparatus and related digital signal up-converting method, and more particularly to a low cost, low power, and low spurs digital quadrature converter and related method.

In wireless communication system, using a digital polar transmitter to transmit RF (Radio Frequency) signal is the most area saving and power efficient way. However, this conventional method needs a high clock rate CORDIC (Coordinate Rotation Digital Computer) that consumes large area and digital power. Moreover, by using the digital polar transmitter, a mechanism is also need to provide for truncating the ultra-wide bandwidth frequency signal when the signal bandwidth increases. In other words, this mechanism degrades the EVM (Error Vector Magnitude) of the transmitted signal when the signal bandwidth increases. Another conventional way to transmit the RF signal is to directly convert the baseband data IQ in RF signal by a DAC (Digital-to-analog Converter), which is so-called I/Q RF DAC. The I/Q RF DAC is good for maintaining signal integrity of the transmitted signal. However, the I/Q RF DAC requires double silicon area to deliver the same amount of power in comparison to the digital polar transmitter counterpart. Therefore, providing a low cost, low power, and high bandwidth digital transmitter is an urgent problem in the field of wireless communication system.

SUMMARY

One objective of the present embodiment is to provide a low cost, low power, and low spurs digital quadrature converter and a related method.

According to a first embodiment of the present invention, a digital signal up-converting apparatus is disclosed. The digital signal up-converting apparatus comprises a clock generating circuit, an adjusting circuit, a baseband circuit, and a sampling circuit. The clock generating circuit is arranged to generate a reference clock signal. The adjusting circuit is coupled to the clock generating circuit, and arranged to generate a first clock signal and a second clock signal according to the reference clock signal. The baseband circuit is coupled to the adjusting circuit for receiving the first clock signal, wherein the baseband circuit further generates a digital output signal according to the first clock signal. The sampling circuit is coupled to the adjusting circuit and the baseband circuit for receiving the second clock signal and the digital output signal, wherein the second clock signal and the digital output signal are non-overlapping, and the sampling circuit samples the digital output signal based on the second clock signal and then combines the sampled digital output signal in order to generate a combined digital signal.

According to a second embodiment of the present invention, a digital signal up-converting apparatus is disclosed. The digital signal up-converting apparatus comprises a clock generating circuit, a phase adjusting circuit, a baseband circuit, and a sampling circuit. The clock generating circuit is arranged to generate a first reference clock signal, a second reference clock signal, a third reference clock signal, and a fourth reference clock signal. The phase adjusting circuit is arranged to adjust the first reference clock signal, the second reference clock signal, the third reference clock signal, and the fourth reference clock signal to generate a first adjusted clock signal, a second adjusted clock signal, a third adjusted clock signal, and a fourth adjusted clock signal. The baseband circuit is arranged to generate a first digital output signal, a second digital output signal, a third digital output signal, and a fourth digital output signal according to a first baseband data, a second baseband data, the first adjusted clock signal, the second adjusted clock signal, the third adjusted clock signal, and the fourth adjusted clock signal. The sampling circuit is arranged to sample the first digital output signal, the second digital output signal, the third digital output signal, and the fourth digital output signal to generate a first sampled digital signal, a second sampled digital signal, a third sampled digital signal, and a fourth digital signal according to the first adjusted clock signal, the second adjusted clock signal, the third adjusted clock signal, and the fourth adjusted clock signal respectively.

According to a third embodiment of the present invention, a digital signal up-converting method is disclosed. The digital signal up-converting method comprises: generating a first reference clock signal, a second reference clock signal, a third reference clock signal, and a fourth reference clock signal; adjusting the first reference clock signal, the second reference clock signal, the third reference clock signal, and the fourth reference clock signal to generate a first adjusted clock signal, a second adjusted clock signal, a third adjusted clock signal, and a fourth adjusted clock signal; generating a first digital output signal, a second digital output signal, a third digital output signal, and a fourth digital output signal according to a first baseband data, a second baseband data, the first adjusted clock signal, the second adjusted clock signal, the third adjusted clock signal, and the fourth adjusted clock signal; and sampling the first digital output signal, the second digital output signal, the third digital output signal, and the fourth digital output signal to generate a first sampled digital signal, a second sampled digital signal, a third sampled digital signal, and a fourth digital signal according to the first adjusted clock signal, the second adjusted clock signal, the third adjusted clock signal, and the fourth adjusted clock signal respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
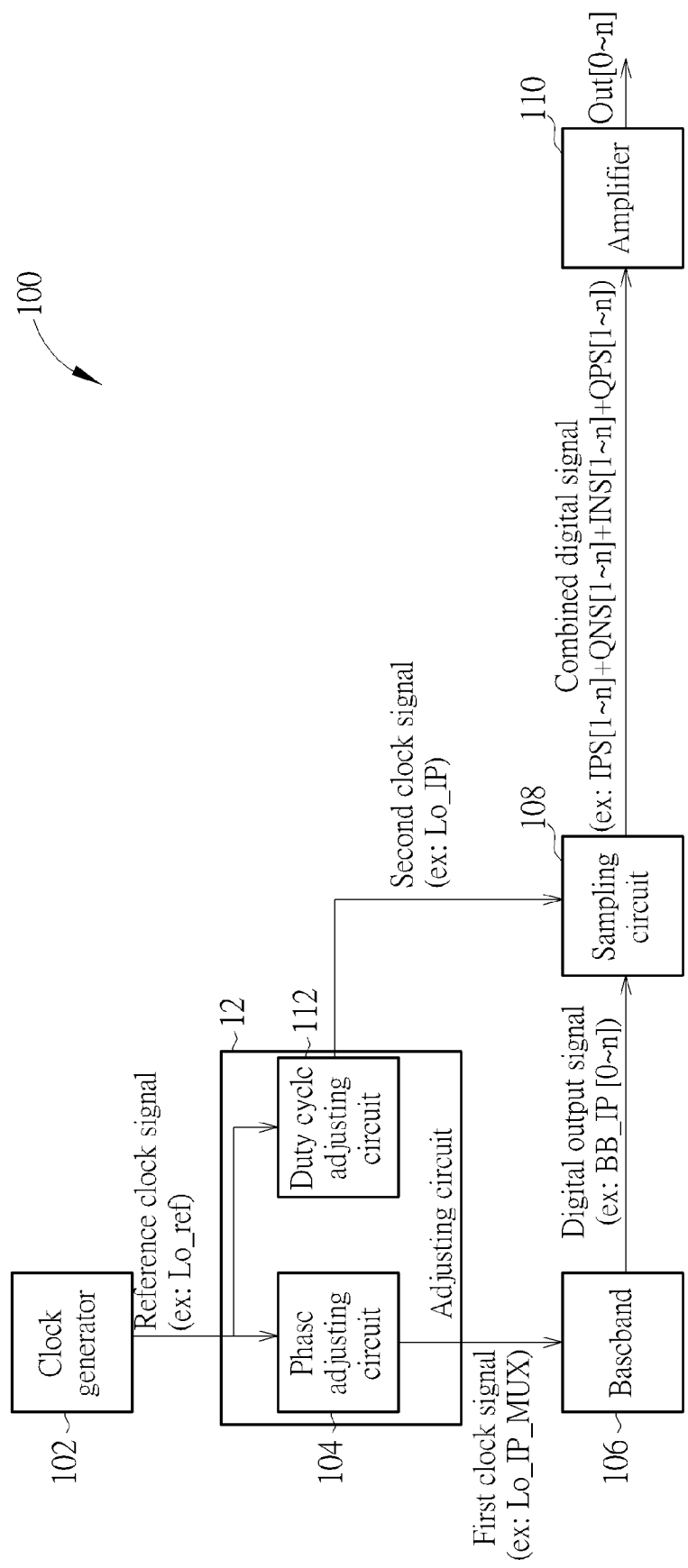
FIG. 1A is a diagram illustrating a simplified digital signal up-converting apparatus according to an embodiment of the present invention.

Please refer to FIG. 1A, which is a diagram illustrating a simplified digital signal up-converting apparatus 100 according to an embodiment of the present invention. The digital signal up-converting apparatus 100 comprises a clock generating circuit 102, an adjusting circuit 12, a baseband circuit 106, a sampling circuit 108, and an amplifier 110. The adjusting circuit 12 comprises a phase adjusting circuit 104 and a duty cycle adjusting circuit 112. Simply speaking, the clock generating circuit 102 is arranged to generate a reference clock signal (e.g. Lo_ref_1). The phase adjusting circuit 104 is arranged to adjust a phase of the reference clock to generate the first clock signal (e.g. Lo_IP_MUX). The duty cycle adjusting circuit 112 is arranged to adjust a duty cycle of the reference clock to generate the second clock signal (e.g. Lo_IP). The baseband circuit 106 is coupled to the phase adjusting circuit 104 for receiving the first clock signal, wherein the baseband circuit 106 further generates a digital output signal (e.g. BB_IP[0~n]) according to the first clock signal. The sampling circuit 108 is coupled to the duty cycle adjusting circuit 112 and the baseband circuit 106 for receiving the second clock signal and the digital output signal, wherein signal edges of the second clock signal and the digital output signal are non-overlapping, and the sampling circuit 108 samples the digital output signal based on the second clock signal and then combines the sampled digital output signal in order to generate a combined digital signal (e.g. IPS[0~n]+QNS[0~n]+INS[0~n]+QPS[0~n]). The amplifier 110 is a switch amplifier arranged to generate an amplified output signal (e.g. Out[0~n]) according to the combined digital signal.

Figure 1B:
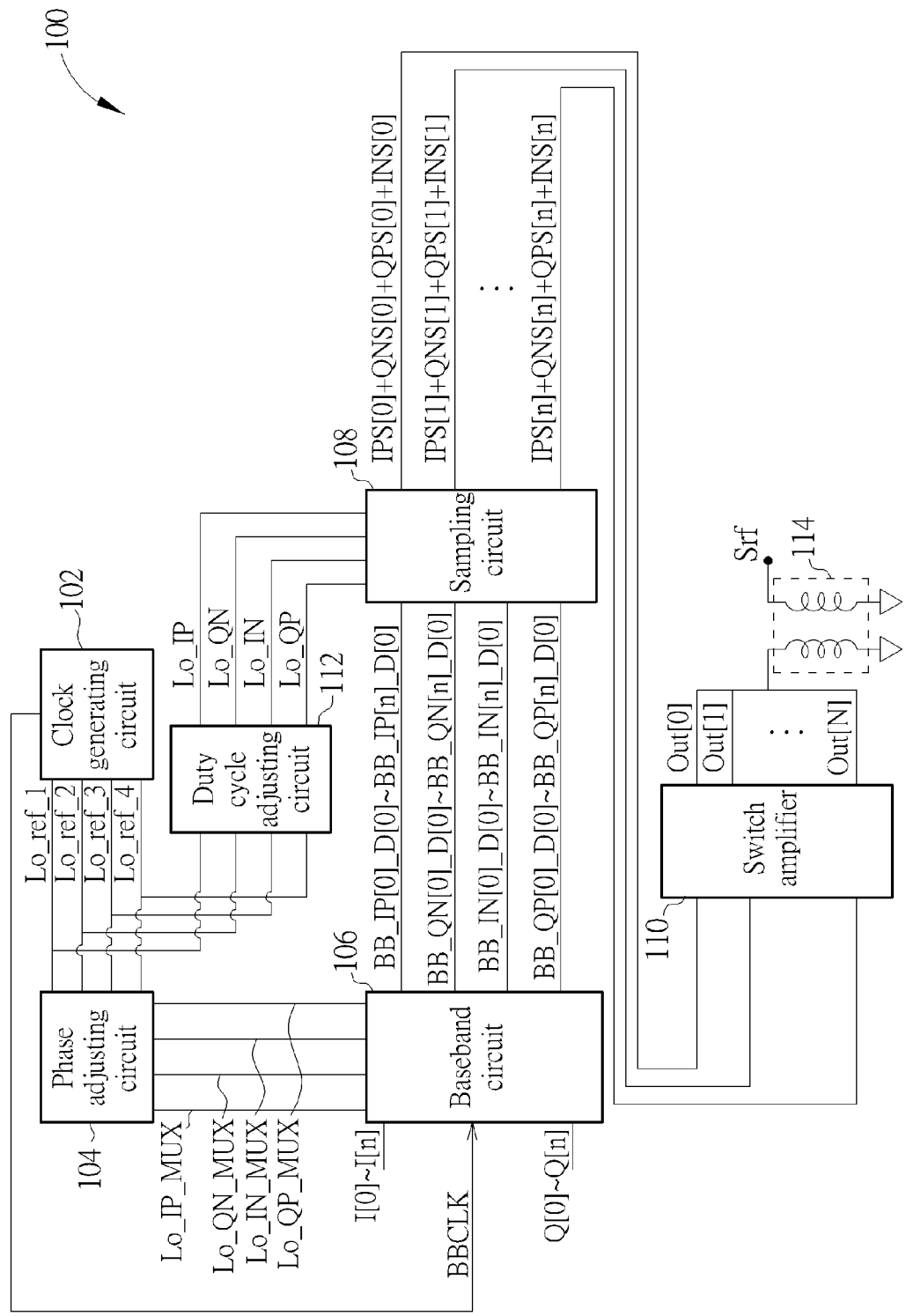
FIG. 1B is a diagram illustrating a more detailed digital signal up-converting apparatus according to an embodiment of the present invention.

More specifically, please refer to FIG. 1B, which is a more detailed diagram illustrating the digital signal up-converting apparatus 100 according to an embodiment of the present invention. In the embodiment, the clock generating circuit 102 is arranged to generate a first reference clock signal Lo_ref_1, a second reference clock signal Lo_ref_2, a third reference clock signal Lo_ref_3, and a fourth reference clock signal Lo_ref_4. The phase adjusting circuit 104 is arranged to adjust the first reference clock signal Lo_ref_1, the second reference clock signal Lo_ref_2, the third reference clock signal Lo_ref_3, and the fourth reference clock signal Lo_ref_4 to generate a first adjusted clock signal LO_IP_MUX, a second adjusted clock signal LO_QN_MUX, a third adjusted clock signal LO_IN_MUX, and a fourth adjusted clock signal LO_QP_MUX. The duty cycle adjusting circuit 112 is arranged to generate a first sampling clock signal LO_IP, a second sampling clock signal LO_QN, a third sampling clock signal LO_IN, and a fourth sampling clock signal LO_QP by adjusting the duty cycles of the first reference clock signal Lo_ref_1, the second reference clock signal Lo_ref_2, the third reference clock signal Lo_ref_3, and the fourth reference clock signal Lo_ref_4 respectively.

The baseband circuit 106 is arranged to generate a first digital output signal BB_IP[0]_D[0]~BB_IP[n]_D[0], a second digital output signal BB_QN[0]_D[0]~BB_QN[n]_D[0], a third digital output signal BB_IN[0]_D[0]~BB_IN[n]_D[0], and a fourth digital output signal BB_QP[0]_D[0]~BB_QP[n]_D[0] according to a first baseband data BB_I[0]~ BB_I[n], a second baseband data BB_Q[0]~BB_Q[n], the first adjusted clock signal LO_IP_MUX, the second adjusted clock signal LO_QN_MUX, the third adjusted clock signal LO_IN_MUX, and the fourth adjusted clock signal LO_QP_MUX.

The sampling circuit 108 is arranged to sample the first digital output signal BB_IP[0]_D[0]~BB_IP[n]_D[0], the second digital output signal BB_QN[0]_D[0]~BB_QN[n]_D[0], the third digital output signal BB_IN[0]_D[0]~BB_IN[n]_D[0], and the fourth digital output signal BB_QP[0]_D[0]~BB_QP[n]_D[0] to generate a first sampled digital signal IPS[0]~IPS[n], a second sampled digital signal QNS[0]~QNS[n], a third sampled digital signal INS[0]~INS[n], and a fourth digital signal QPS[0]~QPS[n] according to the first sampling clock signal LO_IP, the second sampling clock signal LO_QN, the third sampling clock signal LO_IN, and the fourth sampling clock signal LO_QP respectively.

Figure 3:
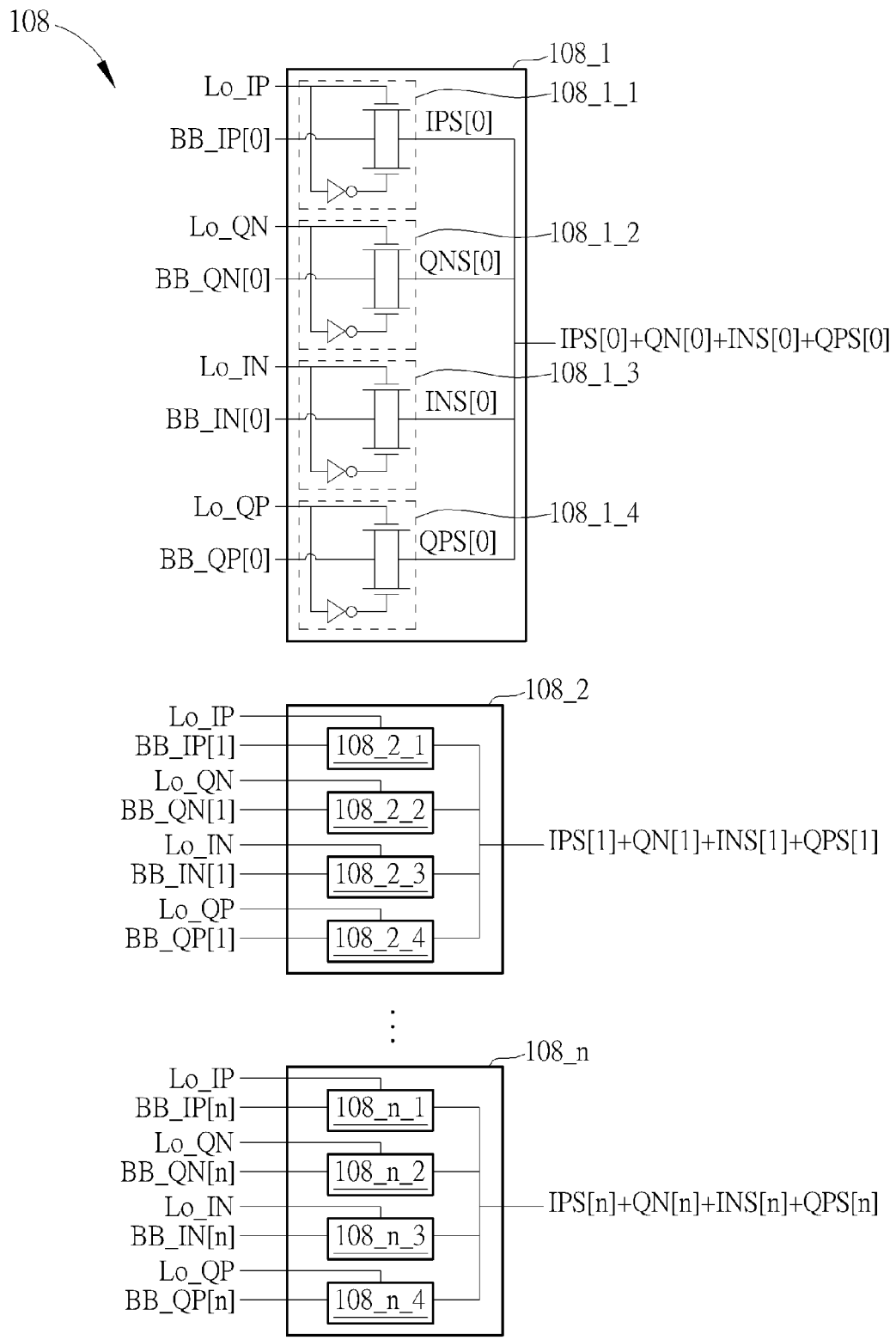
FIG. 3 is a diagram illustrating a sampling circuit of the digital signal up-converting apparatus according to an embodiment of the present invention.

In FIG. 3 that illustrates the detailed circuit diagram of the sampling circuit 108, the sampling circuit block 108_1 further directly combines the sampled digital signals IPS[0], QNS[0], INS[0], QPS[0] in time domain to generate a first combined digital signal, i.e. IPS[0]+QNS[0]+INS[0]+QPS[0]. The sampling circuit block 108_2 further directly combines the sampled digital signals IPS[1], QNS[1], INS[1], QPS[1] in time domain to generate a second combined digital signal, i.e. IPS[1]+QNS[1]+INS[1]+QPS[1]. The sampling circuit block 108_n further directly combines the sampled digital signals IPS[n], QNS[n], INS[n], QPS[n] in time domain to generate an n-th combined digital signal, i.e. IPS[n]+QNS[n]+INS[n]+QPS[n].

The switch amplifier 110 is arranged to generate an amplified output signal Out[0]~Out[n] according to the combined digital signal IPS[0]+QNS[0]+QPS[0]+INS[0]~IPS[n]+QNS[n]+QPS[n]+INS[n].

It is noted that, to more clearly illustrate the operation of the digital signal up-converting apparatus 100, a transforming circuit 114 is also shown in FIG. 1B. The transforming circuit 114 is arranged to transform the amplified output signal Out[0]~Out[n] into an RF signal Srf.

Moreover, according to the present embodiment, the digital signal up-converting apparatus 100 is arranged to up-convert the baseband data, i.e. the first baseband data I[0]~I[n] and the second baseband data Q[0]~Q[n], having n bits into the RF signal Srf, and n can be any positive integer number. The first baseband data I[0]~I[n] is the in-phase data while the second baseband data Q[0]~Q[n] is the quadrature data. In addition, the first reference clock signal Lo_ref_1, the second reference clock signal Lo_ref_2, the third reference clock signal Lo_ref_3, and the fourth reference clock signal Lo_ref_4 are four clock signals having the same oscillating frequency but different phases. More specifically, the first reference clock signal Lo_ref_1, the second reference clock signal Lo_ref_2, the third reference clock signal Lo_ref_3, and the fourth reference clock signal Lo_ref_4 have phases 0°, 90°, 180°, 270° respectively.

Figure 2:
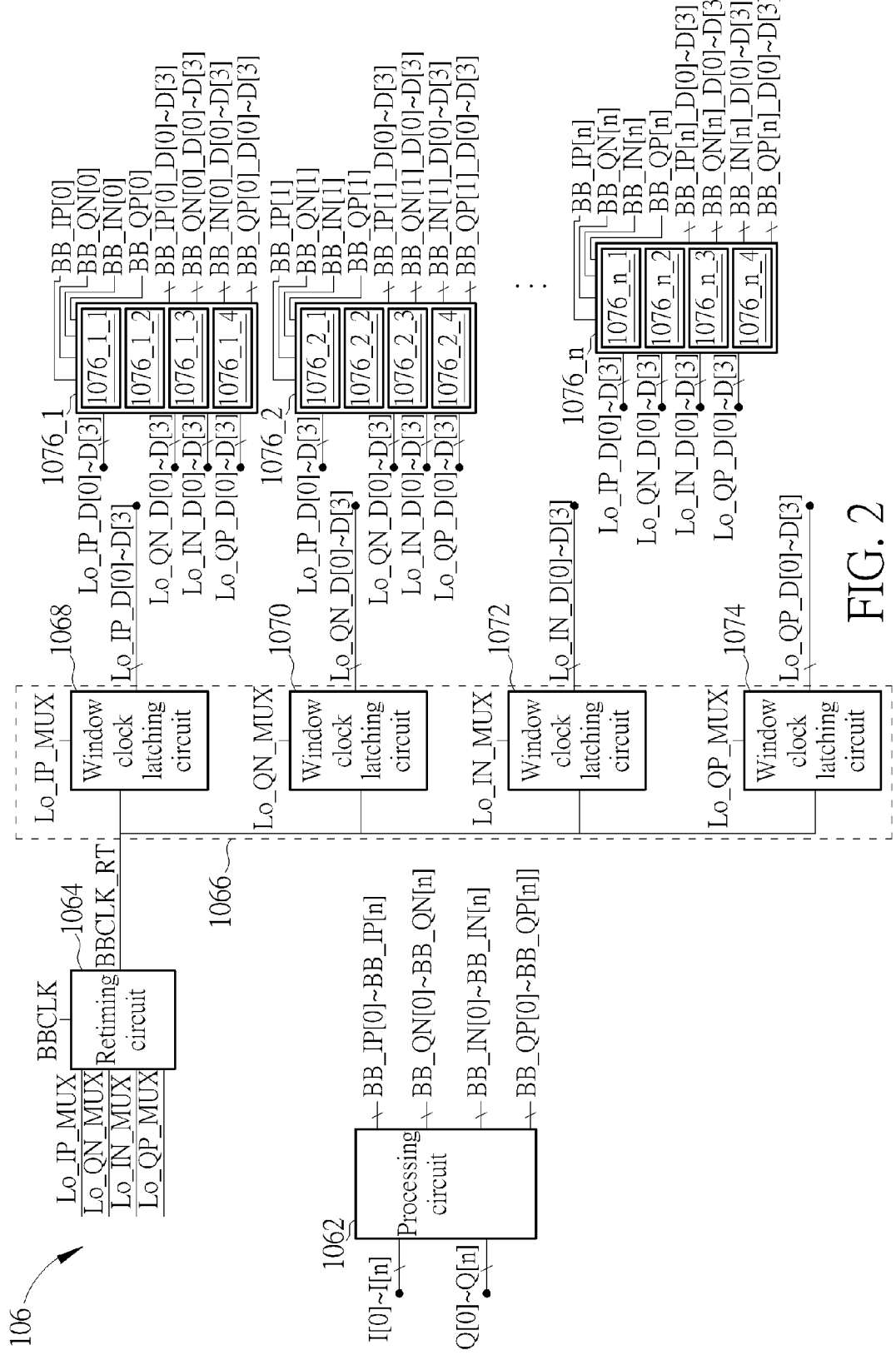
FIG. 2 is a diagram illustrating a baseband circuit of the digital signal up-converting apparatus according to an embodiment of the present invention.

Please refer to FIG. 2, which is a diagram illustrating the baseband circuit 106 of the digital signal up-converting apparatus 100 according to an embodiment of the present invention. In the exemplary embodiment as shown in FIG. 2, the baseband circuit 106 comprises a processing circuit 1062, a retiming circuit 1064, a window clock generator 1066, and n latching circuit blocks 1076_1~1076_n. The window clock generator 1066 comprises a first window clock latching circuit 1068, a second window clock latching circuit 1070, a third window clock latching circuit 1072, and a fourth window clock latching circuit 1074. The processing circuit 1062 is arranged to generate a first digital data BB_IP[0]~BB_IP[n], a second digital data BB_QN[0]~BB_QN[n], a third digital data BB_IN[0]~BB_IN[n], and a fourth digital data BB_QP[0]~BB_QP[n] according to the first baseband data I[0]~I[n] and the second baseband data Q[0]~Q[n]. The retiming circuit 1064 is arranged to generate a retime window clock BBCLK_RT according to a baseband window clock BBCLK generated by the clock generating circuit, and one of the first adjusted clock signal LO_IP_MUX, the second adjusted clock signal LO_QN_MUX, the third adjusted clock signal LO_IN_MUX, and the fourth adjusted clock signal LO_QP_MUX. The first window clock latching circuit 1068 is arranged to generate a plurality of first window clocks LO_IP_D[0]~LO_IP_D[3] according to the retime window clock BBCLK_RT and the first adjusted clock signal LO_IP_MUX. The second window clock latching circuit 1070 is arranged to generate a plurality of second window clocks LO_QN_D[0]~LO_QN_D[3] according to the retime window clock BBCLK_RT and the second adjusted clock signal LO_QN_MUX. The third window clock latching circuit 1072 is arranged to generate a plurality of third window clocks LO_IN_D[0]~LO_IN_D[3] according to the retime window clock BBCLK_RT and the third adjusted clock signal LO_IN_MUX. The fourth window clock latching circuit 1074 is arranged to generate a plurality of fourth window clocks LO_QP_D[0]~LO_QP_D[3] according to the retime window clock BBCLK_RT and the fourth adjusted clock signal LO_QP_MUX. It is noted that, for hereinafter, the symbol D[ ] represents delay of a signal, thus the symbol D[0] means the first delay, the symbol D[1] means the second delay, the symbol D[2] means the third delay, and the symbol D[3] means the fourth delay.

In addition, the amount of the latching circuit blocks 1076_1~1076_n is n, in which n is the bit number of the digital data BB_IP[0]~BB_IP[n], BB_QN[0]~BB_QN[n], BB_IN[0]~BB_IN[n], BB_QP[0]~BB_QP[n]. The first latching circuit block 1076_1 is arranged to deal with the first bit BB_IP[0], BB_QN[0], BB_IN[0], BB_QP[0] in the digital data BB_IP[0]~BB_IP[n], BB_QN[0]~BB_QN[n], BB_IN[0]~BB_IN[n], BB_QP[0]~BB_QP[n] respectively. The second latching circuit block 1076_2 is arranged to deal with the second bit BB_IP[1], BB_QN[1], BB_IN[1], BB_QP[1] in the digital data BB_IP[0]~BB_IP[n], BB_QN[0]~BB_QN[n], BB_IN[0]~BB_IN[n], BB_QP[0]~BB_QP[n] respectively, and so on. Each latching circuit block comprises four data latching circuit. As in FIG. 2, the first latching circuit block 1076_1 comprises a first data latching circuit 1076_1_1, a second data latching circuit 1076_1_2, a third data latching circuit 1076_1_3, and a fourth data latching circuit 1076_1_4. The second latching circuit block 1076_2 comprises a first data latching circuit 1076_2_1, a second data latching circuit 1076_2_2, a third data latching circuit 1076_2_3, and a fourth data latching circuit 1076_2_4. The last latching circuit block 1076_n comprises a first data latching circuit 1076_n_1, a second data latching circuit 1076_n_2, a third data latching circuit 1076_n_3, and a fourth data latching circuit 1076_n_4. It is noted that all of the latching circuit blocks 1076_1~1076_n operate in the similar way.

In the first latching circuit block 1076_1, the first data latching circuit 1076_1_1 is arranged to generate the first digital output signal BB_IP[0]_D[0]~BB_IP[0]_D[3] according to the first bit of digital data BB_IP[0] and the plurality of first window clocks LO_IP_D[0]~LO_IP_D[3]. The second data latching circuit 1076_1_2 is arranged to generate the second digital output signal BB_QN[0]_D[0]~BB_QN[0]_D[3] according to the first bit of digital data BB_QN[0] and the plurality of second window clocks LO_QN_D[0]~LO_QN_D[3]. The third data latching circuit 1076_1_3 is arranged to generate the third digital output signal BB_IN[0]_D[0]~BB_IN[0]_D[3] according to the first bit of digital data BB_IN[0] and the plurality of third window clocks LO_IN_D[0]~LO_IN_D[3]. The fourth data latching circuit 1076_1_4 is arranged to generate the fourth digital output signal BB_QP[0]_D[0]~BB_QP[0]_D[3] according to the first bit of digital data BB_QP[0] and the plurality of fourth window clocks LO_QP_D[0]~LO_QP_D[3].

Similar to the first latching circuit blocks 1076_1, the second latching circuit blocks 1076_2 is arranged to a plurality of first digital output signal BB_IP[1]_D[0]~BB_IP[1]_D[3], a plurality of second digital output signal BB_QN[1]_D[0]~BB_QN[1]_D[3], a plurality of third digital output signal BB_IN[1]_D[0]~BB_IN[1]_D[3], and a plurality of fourth digital output signal BB_QP[1]_D[0]~BB_QP[1]_D[3]. The n-th latching circuit blocks 1076_n is arranged to a plurality of first digital output signal BB_IP[n]_D[0]~BB_IP[n]_D[3], a plurality of second digital output signal BB_QN[n]_D[0]~BB_QN[n]_D[3], a plurality of third digital output signal BB_IN[n]_D[0]~BB_IN[n]_D[3], and a plurality of fourth digital output signal BB_QP[n]_D[0]~BB_QP[n]_D[3].

According to the present invention, one of the plurality of first digital output signal BB_IP[0]_D[0]~BB_IP[0]_D[3], one of the plurality of first digital output signal BB_IP[1]_D[0]~BB_IP[1]_D[3], and one of the plurality of first digital output signal BB_IP[n]_D[0]~BB_IP[n]_D[3] are selected and outputted respectively. One of the plurality of second digital output signal BB_QN[0]_D[0]~BB QN[0]_D[3], one of the plurality of second digital output signal BB_QN[1]_D[0]~BB_QN[1]_D[3], and one of the plurality of second digital output signal BB_QN[n]_D[0]~BB_QN[n]_D[3] are selected and outputted respectively. One of the plurality of third digital output signal BB_IN[0]_D[0]~BB_IN[0]_D[3], one of the plurality of third digital output signal BB_IN[1]_D[0]~BB_IN[1]_D[3], and one of the plurality of third digital output signal BB_IN[n]_D[0]~BB_IN[n]_D[3] are selected and outputted respectively. One of the plurality of fourth digital output signal BB_QP[0]_D[0]~BB_QP[0]_D[3], one of the plurality of fourth digital output signal BB_QP[1]_D[0]~BB_QP[1]_D[3], and one of the plurality of fourth digital output signal BB_QP[n]_D[0]~BB_QP[n]_D[3] are selected and outputted respectively.

More specifically, in this embodiment, as illustrated in FIG. 1B, the digital output signal BB_IP[0]_D[0], BB_IP[1]_D[0], . . . , BB_IP[n]_D[0](i.e. the first delay data) are selected and outputted to be the first digital output signal BB_IP[0]_D[0]~BB_IP[n]_D[0]. Similarly, the BB_QN[0]_D[0], BB_QN[1]_D[0], . . . , BB_QN[n]_D[0](i.e. the first delay data) are selected and outputted to be the second digital output signal BB_QN[0]_D[0]~BB_QN[n]_D[0]. The BB_IN[0]_D[0], BB_IN[1]_D[0], . . . , BB_IN[n]_D[0](i.e. the first delay data) are selected and outputted to be the third digital output signal BB_IN[0]_D[0]~BB_IN[n]_D[0]. The BB_QP[0]_D[0], BB_QP[1]_D[0], . . . , BB_QP[n]_D[0](i.e. the first delay data) are selected and outputted to be the fourth digital output signal BB_QP[0]_D[0]~BB_QP[n]_D[0]. It is noted that this is just an example of the present embodiment, and this is not a limitation of the present invention. The second delay data or the third or the fourth delay data can also be selected and outputted to be the corresponding digital output signal to avoid the overlapping of the digital output signal edge and the sampling clock signal edge.

Please refer to FIG. 3, which is a diagram illustrating the sampling circuit 108 of the digital signal up-converting apparatus 100 according to an embodiment of the present invention. The sampling circuit 108 comprises n sampling circuit blocks 108_1~108_n. Similarly, the amount of the sampling circuit blocks 108_1~108_n is also n. The first sampling circuit block 108_1 is arranged to deal with the digital output signal BB_IP[0]_D[0], BB_QN[0]_D[0], BB_IN[0]_D[0], BB_QP[0]_D[0]. The second sampling circuit block 108_2 is arranged to deal with the digital output signal BB_IP[1]_D[0], BB_QN[1]_D[0], BB_IN[1]_D[0], BB_QP[1]_D[0]. The n-th sampling circuit block 108_n is arranged to deal with the digital output signal BB_IP[n]_D[0], BB_QN[n]_D[0], BB_IN[n]_D[0], BB_QP[n]_D[0].

Each sampling circuit block comprises four pass gates. As in FIG. 3, the first sampling circuit block 108_1 comprises a first pass gate 108_1_1, a second pass gate 108_1_2, a third pass gate 108_1_3, and a fourth pass gate 108_1_4. The second sampling circuit block 108_2 comprises a first pass gate 108_2_1, a second pass gate 108_2_2, a third pass gate 107_2_3, and a fourth pass gate 108_2_4. The last sampling circuit block 108_n comprises a first pass gate 108_n_1, a second pass gate 108_n_2, a third pass gate 108_n_3, and a fourth pass gate 108_n_4. Each pass gate comprises two MOSFETs and one inverter. The connectivity of those pass gates are illustrated in FIG. 3, thus the detailed description is omitted here for brevity. It is noted that all of the sampling circuit blocks 108_1~108_n operate in the similar way.

In the first sampling circuit block 108_1, the first pass gate 108_1_1, the second pass gate 108_1_2, the third pass gate 108_1_3, and the fourth pass gate 108_1_4 are arranged to sample the digital output signal BB_IP[0]_D[0], BB_QN[0]_D[0], BB_IN[0]_D[0], BB_QP[0]_D[0] to generate the sampled digital signals IPS[0], QNS[0], INS[0], QPS[0] according to the first sampling clock signal LO_IP, the second sampling clock signal LO_QN, the third sampling clock signal LO_IN, and the fourth sampling clock signal LO_QP respectively.

In the second sampling circuit block 108_2, the first pass gate 108_2_1, the second pass gate 108_2_2, the third pass gate 108_2_3, and the fourth pass gate 108_2_4 are arranged to sample the digital output signal BB_IP[1]_D[0], BB_QN[1]_D[0], BB_IN[1]_D[0], BB_QP[1]_D[0] to generate the sampled digital signals IPS[1], QNS[1], INS[1], QPS[1] according to the first sampling clock signal LO_IP, the second sampling clock signal LO_QN, the third sampling clock signal LO_IN, and the fourth sampling clock signal LO_QP respectively.

In the n-th sampling circuit block 108_n, the first pass gate 108_n_1, the second pass gate 108_n_2, the third pass gate 108_n_3, and the fourth pass gate 108_n_4 are arranged to sample the digital output signal BB_IP[n]_D[0], BB_QN[n]_D[0], BB_IN[n]_D[0], BB_QP[n]_D[0] to generate the sampled digital signals IPS[n], QNS[n], INS[n], QPS[n] according to the first sampling clock signal LO_IP, the second sampling clock signal LO_QN, the third sampling clock signal LO_IN, and the fourth sampling clock signal LO_QP respectively.

In addition, the sampled digital signals IPS[0], QNS[0], INS[0], QPS[0] are further directly combined in time domain to generate the first combined digital signal, i.e. IPS[0]+QNS[0]+INS[0]+QPS[0]. The sampled digital signals IPS[1], QNS[1], INS[1], QPS[1] are further directly combined in time domain to generate the second combined digital signal, i.e. IPS[1]+QNS[1]+INS[1]+QPS[1]. The sampled digital signals IPS[n], QNS[n], INS[n], QPS[n] are further directly in time domain to generate the n-th combined digital signal, i.e. IPS[n]+QNS[n]+INS[n]+QPS[n].

Figure 4:
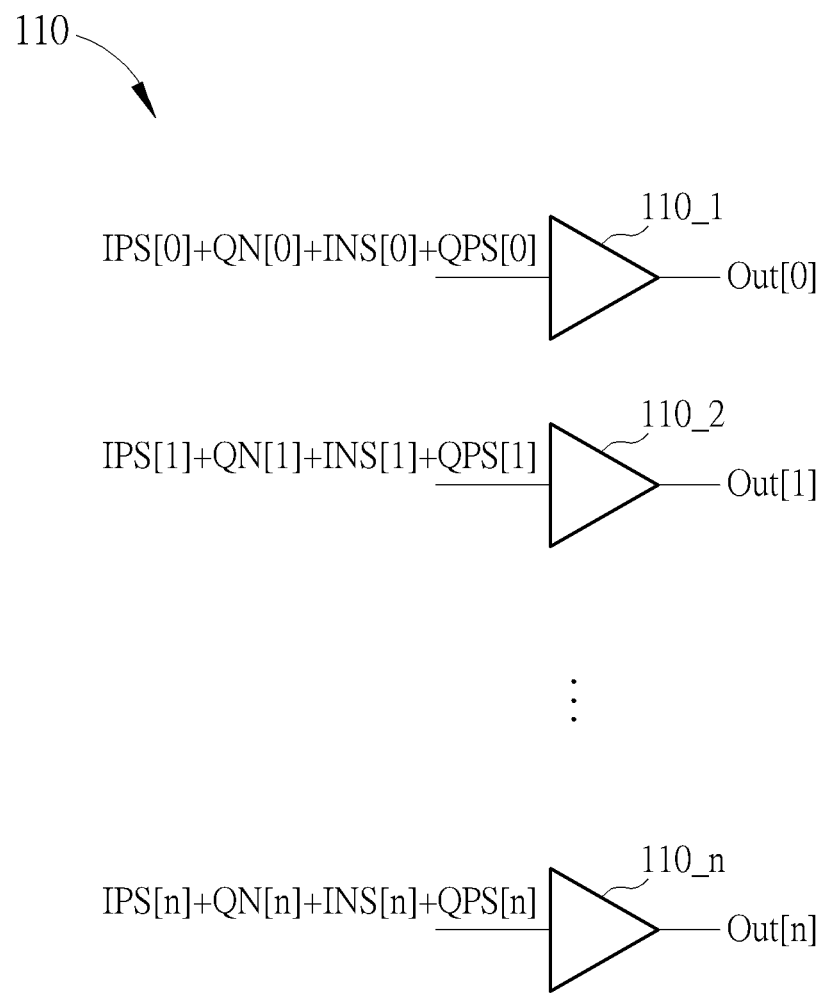
FIG. 4 is a diagram illustrating a switch amplifier of the digital signal up-converting apparatus according to an embodiment of the present invention.

Please refer to FIG. 4, which is a diagram illustrating the switch amplifier 110 of the digital signal up-converting apparatus 100 according to an embodiment of the present invention. The switch amplifier 110 comprises n switch amplifier blocks 110_1~110_n. Similarly, the amount of the switch amplifier blocks 110_1~110_n is also n. The first switch amplifier block 110_1 is arranged to amplify the first combined digital signal, i.e. IPS[0]+QNS[0]+INS[0]+QPS[0], to generate the first amplified output signal Out[0]. The second switch amplifier block 110_2 is arranged to amplify the second combined digital signal, i.e. IPS[1]+QNS[1]+INS[1]+QPS[1], to generate the second amplified output signal Out[1]. The n-th switch amplifier block 110_n is arranged to amplify the n-th combined digital signal, i.e. IPS[n]+QNS[n]+INS[n]+QPS[n], to generate the n-th amplified output signal Out[n].

Generally speaking, according to the present invention, the processing circuit 1062 is arranged to subtract the second baseband data Q[n] from the first baseband data I[n] to generate the first digital data BB_IP[n], to add up the first baseband data I[n] and the second baseband data Q[n] to generate the second digital data BB_QN[n], to inverse the first digital data BB_IP[n] to generate the third digital data BB_IN[n], and to inverse the second digital data BB_QN[n] to generate the fourth digital data BB_QP[n]. Then, the first digital data BB_IP[n], the second digital data BB_QN[n], the third digital data BB_IN[n], and the fourth digital data BB_QP[n] are up-converted by four non-overlapping clock signals (i.e. the above-mentioned first sampling clock signal LO_IP, the second sampling clock signal LO_QN, the third sampling clock signal LO_IN, and the fourth sampling clock signal LO_QP) respectively. The up-conversion of the first baseband data I[n] and the second baseband data Q[n] can be simply represented by the following equation:

$$RFout[n]=I[n] \cdot LO_I[n]+Q[n] \cdot LO_Q[n]=(I[n]-Q[n]) \cdot LO\_1[n]+(I[n]+Q[n]) \cdot LO\_2[n]+(-I[n]+Q[n]) \cdot LO\_3[n]+(-I[n]-Q[n]) \cdot LO\_4[n]$$

$LO_I[n]$ and $LO_Q[n]$ represent a digital in-phase oscillating signal and a digital quadrature oscillating signal respectively, $LO\_1[n]$, $LO\_2[n]$, $LO\_3[n]$, and $LO\_4[n]$ represent the presented first sampling clock signal LO_IP, the second sampling clock signal LO_QN, the third sampling clock signal LO_IN, and the fourth sampling clock signal LO_QP respectively. RFout[n] is the up-conversion signal to be transmitted to a differential switch power amplifier (e.g. the n-th switch amplifier block 110_n).

Therefore, according to the present embodiment, when the positive side of the gate of the differential switch power amplifier has data, the negative side of the gate of the differential switch power amplifier will definitely present zero input. Accordingly, no power loss would be induced by the differential devices turning no simultaneously. It is noted that the target power is predefined.

Figure 5:
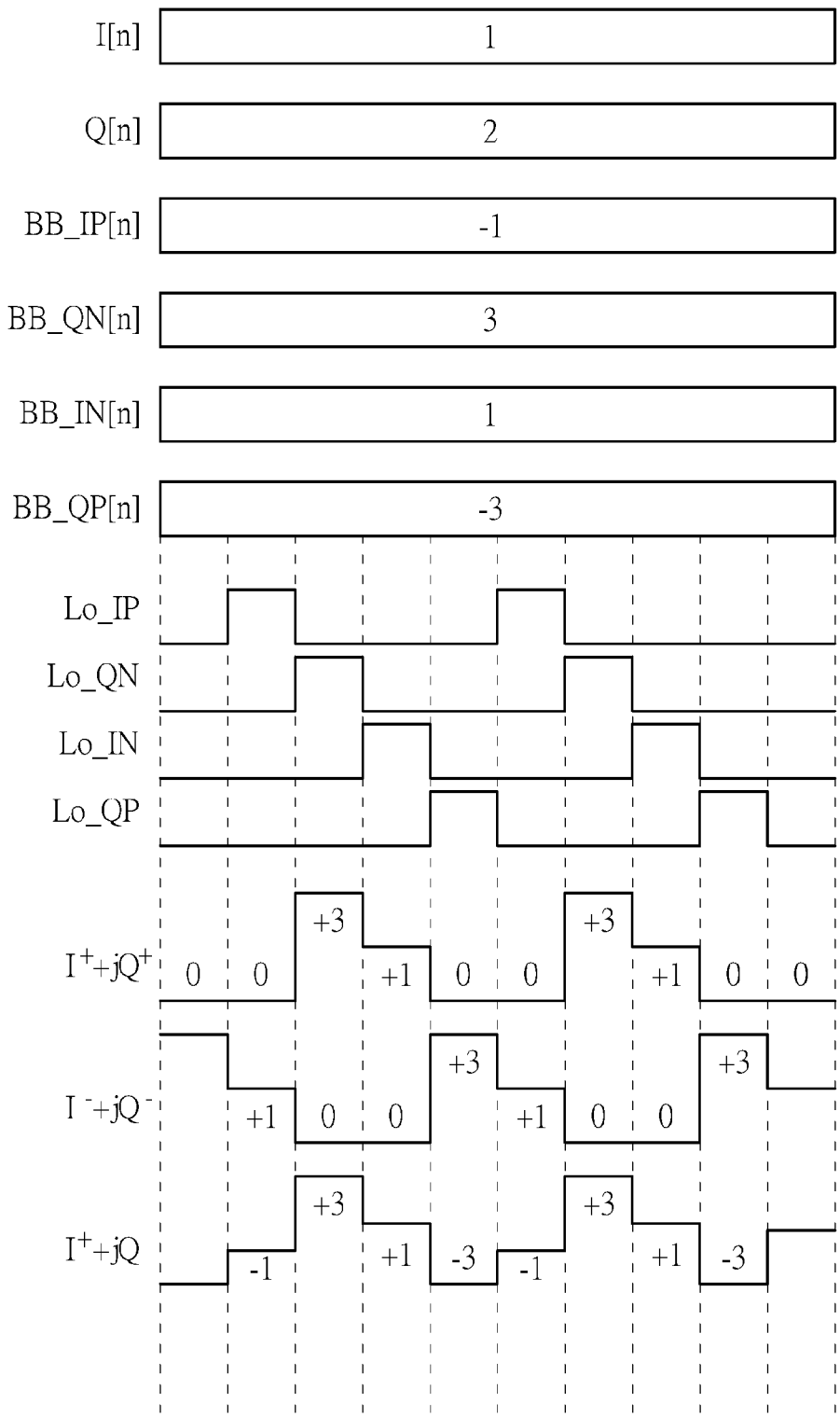
FIG. 5 is a timing diagram illustrating a first baseband data, a second baseband data, a first digital data, a second digital data, a third digital data, a fourth digital data, a first sampling clock signal, a second sampling clock signal, a third sampling clock signal, a fourth sampling clock signal, a data at the positive side of the gate of a differential switch power amplifier, a data at the negative side of the gate of the differential switch power amplifier, a data at the drain of the differential switch power amplifier according to an embodiment of the present invention.

More specifically, please refer to FIG. 5, which is a timing diagram illustrating the first baseband data I[n], the second baseband data Q[n], the first digital data BB_IP[n], the second digital data BB_QN[n], the third digital data BB_IN[n], the fourth digital data BB_QP[n], the first sampling clock signal LO_IP, the second sampling clock signal LO_QN, the third sampling clock signal LO_IN, the fourth sampling clock signal LO_QP, the data I$^+$+jQ$^+$ at the positive side of the gate of the differential switch power amplifier, the data I$^-$+jQ$^-$ at the negative side of the gate of the differential switch power amplifier, the data I+jQ (i.e. RFout[n]) at the drain of the differential switch power amplifier according to an embodiment of the present invention.

For example, if the values of the first baseband data I[n] and the second baseband data Q[n] are 1 and 2 respectively, then the values of the first digital data BB_IP[n], the second digital data BB_QN[n], the third digital data BB_IN[n], and the fourth digital data BB_QP[n] outputted by the processing circuit 1062 are −1, 3, 1, −3 respectively. At time t1, the first sampling clock signal LO_IP samples the value −1 of the first digital data BB_IP[n]. Then, the value 1 is inputted to the negative side of the gate of the differential switch power amplifier while the positive side of the gate of the differential switch power amplifier receives data zero. At time t2, the second sampling clock signal LO_QN samples the value 3 of the second digital data BB_QN[n]. Then, the value 3 is inputted to the positive side of the gate of the differential switch power amplifier while the negative side of the gate of the differential switch power amplifier receives data zero. At time t3, the third sampling clock signal LO_IN samples the value 1 of the third digital data BB_IN[n]. Then, the value 1 is inputted to the positive side of the gate of the differential switch power amplifier while the negative side of the gate of the differential switch power amplifier receives data zero. At time t4, the fourth sampling clock signal LO_QP samples the value −3 of the fourth digital data BB_QP[n]. Then, the value 3 is inputted to the negative side of the gate of the differential switch power amplifier while the positive side of the gate of the differential switch power amplifier receives data zero. Accordingly, when the differential switch power amplifier receives the data I$^+$+jQ$^+$ at the positive side of the gate and the data I$^-$+jQ$^-$ at the negative side of the gate, the values (i.e. the data I+jQ) outputted at the drain of the differential switch power amplifier are −1, 3, 1, −3 at the times t1, t2, t3, t4 respectively. Therefore, the output values −1, 3, 1, −3 at the drain of the differential switch power amplifier are consistent with the values by using the conventional way (i.e. $I[n] \cdot LO_I[n]+Q[n] \cdot LO_Q[n]$) to up-convert the first baseband data I[n] and the second baseband data Q[n].

Accordingly to the operation as shown in FIG. 5, there is no negative value is inputted to the positive or the negative side of the gate of the differential switch power amplifier. The positive or the negative side of the gate of the differential switch power amplifier either receives a positive value or receive data zero. In other words, when the positive side of the gate of the differential switch power amplifier has data, the negative side of the gate of the differential switch power amplifier will definitely present zero input. Therefore, no power loss would be induced by the differential devices turning no simultaneously.

Figure 6:
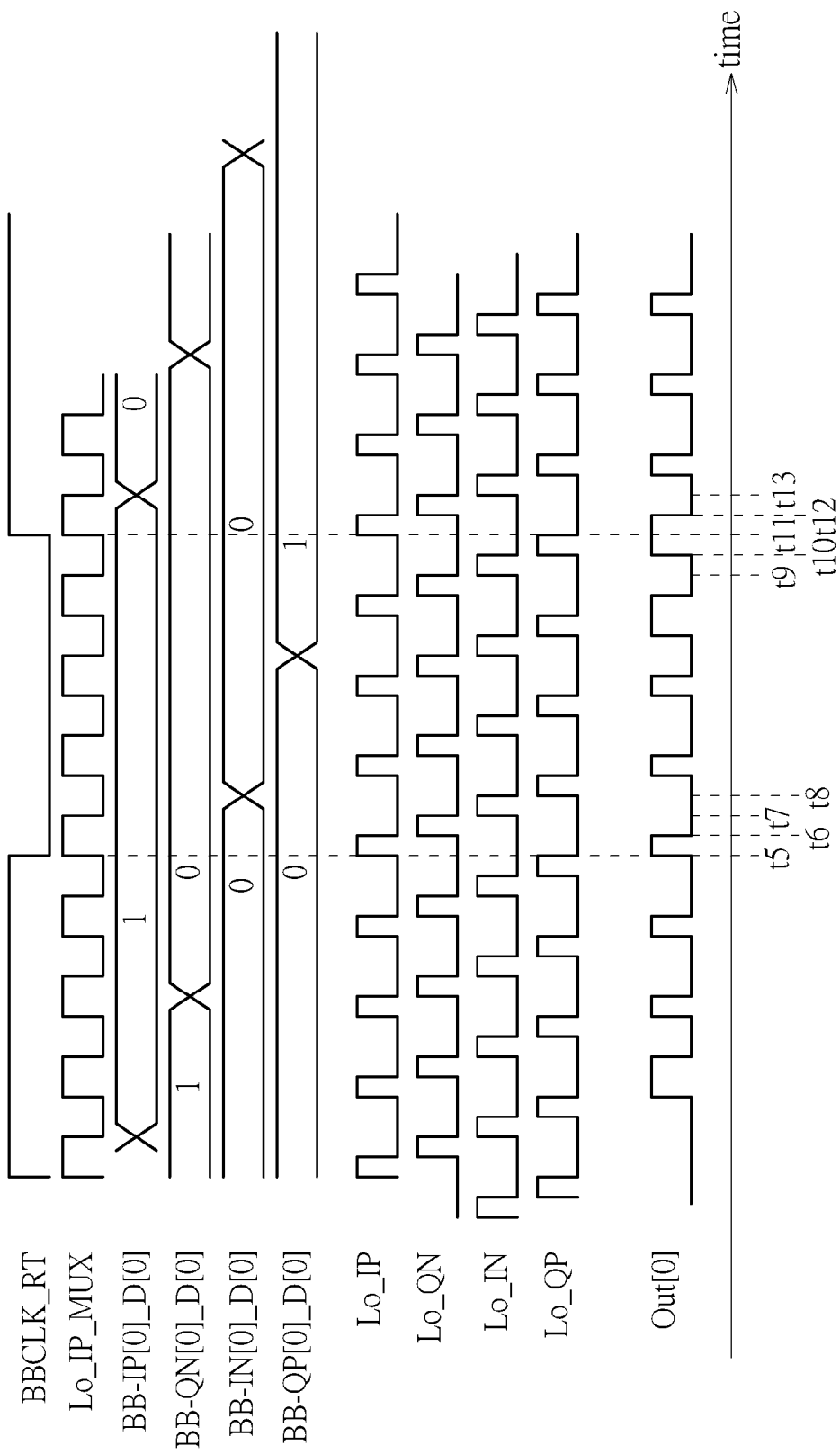
FIG. 6 is a timing diagram illustrating a retime window clock, a first adjusted clock signal, a first digital output signal, a second digital output signal, a third digital output signal, a fourth digital output signal, a first sampling clock signal, a second sampling clock signal, a third sampling clock signal, a fourth sampling clock signal, and a first amplified output signal according to an embodiment of the present invention.

For the more detail operation of the digital signal up-converting apparatus 100, please refer to FIG. 6. FIG. 6 is a timing diagram illustrating the retime window clock BBCLK_RT, the first adjusted clock signal LO_IP_MUX, the first digital output signal BB_IP[0]_D[0], the second digital output signal BB_QN[0]_D[0], the third digital output signal BB_IN[0]_D[0], the fourth digital output signal BB_QP[0]_D[0], the first sampling clock signal LO_IP, the second sampling clock signal LO_QN, the third sampling clock signal LO_IN, the fourth sampling clock signal LO_QP, and the first amplified output signal Out[0] according to an embodiment of the present invention. In this embodiment, the first sampling clock signal LO_IP, the second sampling clock signal LO_QN, the third sampling clock signal LO_IN, and the fourth sampling clock signal LO_QP are used to sample the first digital output signal BB_IP[0]_D[0], the second digital output signal BB_QN[0]_D[0], the third digital output signal BB_IN[0]_D[0], and the fourth digital output signal BB_QP[0]_D[0] respectively. The sampled outputs are then directly combined in time domain and outputted to be the first amplified output signal Out[0]. For one example, at time t5, the first sampling clock signal LO_IP turns on the first pass gate 108_1_1 to output the high voltage level (i.e. digit 1) of the first digital output signal BB_IP[0]_D[0]. At time t6, the second sampling clock signal LO_QN turns on the second pass gate 108_1_2 to output the low voltage level (i.e. digit 0) of the second digital output signal BB_QN[0]_D[0]. At time t7, the third sampling clock signal LO_IN turns on the third pass gate 108_1_3 to output the low voltage level (i.e. digit 0) of the third digital output signal BB_IN[0]_D[0]. At time t8, the fourth sampling clock signal LO_QP turns on the fourth pass gate 108_1_4 to output the low voltage level (i.e. digit 0) of the fourth digital output signal BB_QP[0]_D[0].

For another example, at time t9, the fourth sampling clock signal LO_QP turns on the fourth pass gate 108_1_4 to output the high voltage level (i.e. digit 1) of the fourth digital output signal BB_QP[0]_D[0]. At time t10, the first sampling clock signal LO_IP turns on the first pass gate 108_1_1 to output the high voltage level (i.e. digit 1) of the first digital output signal BB_IP[0]_D[0]. At time t11, the second sampling clock signal LO_QN turns on the second pass gate 108_1_2 to output the low voltage level (i.e. digit 0) of the second digital output signal BB_QN[0]_D[0]. At time t12, the third sampling clock signal LO_IN turns on the third pass gate 108_1_3 to output the low voltage level (i.e. digit 0) of the third digital output signal BB_IN[0]_D[0].

As shown in FIG. 6, the duty cycles of the first sampling clock signal LO_IP, the second sampling clock signal LO_QN, the third sampling clock signal LO_IN, and the fourth sampling clock signal LO_QP are substantially 25%, and the high voltage levels of the first sampling clock signal LO_IP, the second sampling clock signal LO_QN, the third sampling clock signal LO_IN, and the fourth sampling clock signal LO_QP are non-overlapping. Moreover, the signal edges (i.e. voltage switching edges) of the first sampling clock signal LO_IP, the second sampling clock signal LO_QN, the third sampling clock signal LO_IN, and the fourth sampling clock signal LO_QP are also not overlapped with the data edges (i.e. i.e. voltage switching edges) of the first digital output signal BB_IP[0]_D[0], the second digital output signal BB_QN[0]_D[0], the third digital output signal BB_IN[0]_D[0], and the fourth digital output signal BB_QP[0]_D[0]respectively. Therefore, no spurs is induced in the first amplified output signal Out[0].

Figure 7:
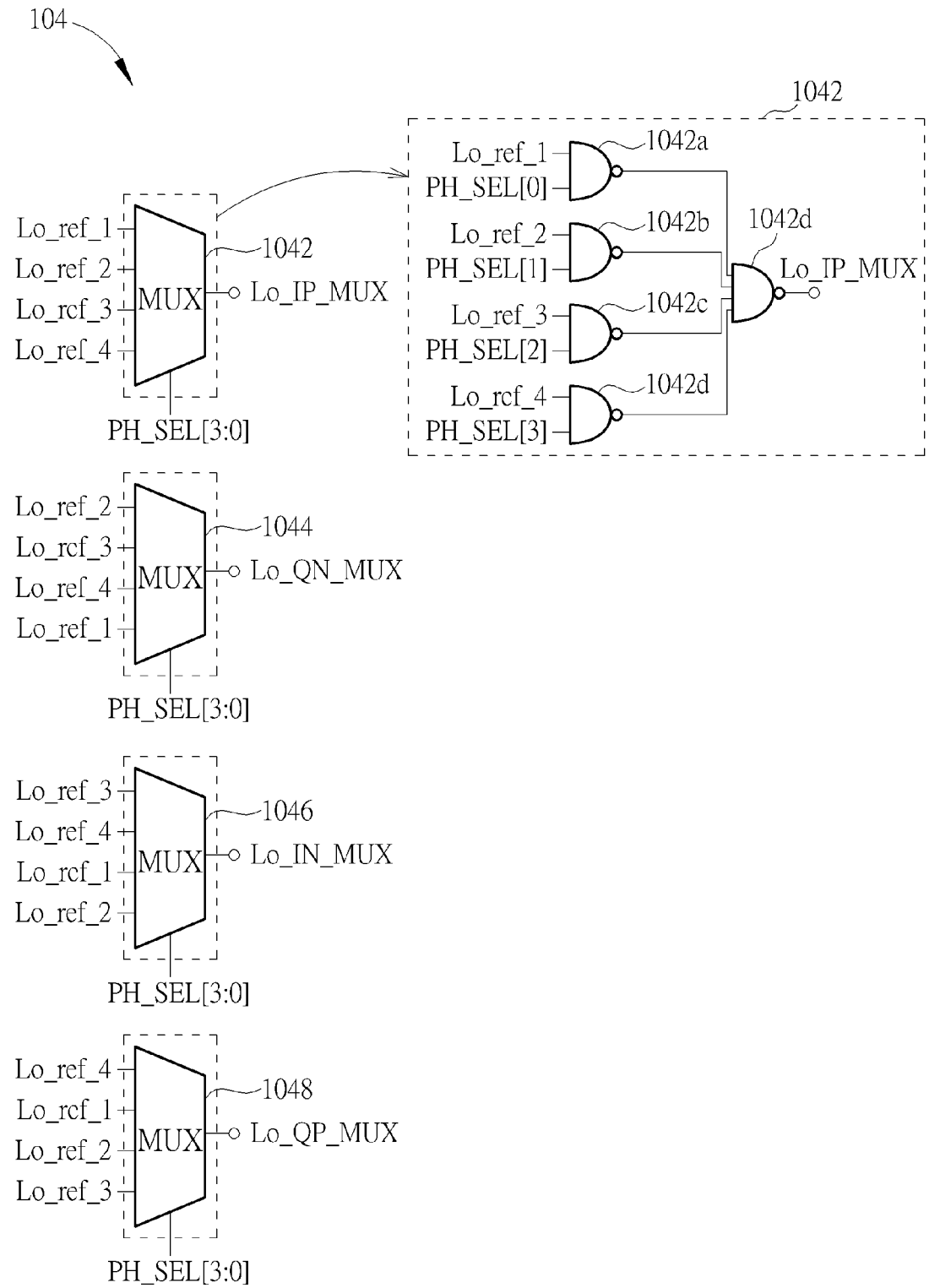
FIG. 7 is a diagram illustrating a phase adjusting circuit of the digital signal up-converting apparatus according to an embodiment of the present invention.

Please refer to FIG. 7, which is a diagram illustrating the phase adjusting circuit 104 of the digital signal up-converting apparatus 100 according to an embodiment of the present invention.

The phase adjusting circuit 104 comprises four multiplexers (MUX) 1042, 1044, 1046, 1048. Each multiplexer is arranged to receive the first reference clock signal Lo_ref_1, the second reference clock signal Lo_ref_2, the third reference clock signal Lo_ref_3, and the fourth reference clock signal Lo_ref_4, and is controlled by a selecting signal PH_SEL[3:0]. The selecting signal PH_SEL[3:0] may be a four bit signal, and each bit is arranged to deal with one of the reference clock signals Lo_ref_1, Lo_ref_2, Lo_ref_3, Lo_ref_4. For example, the first multiplexer 1042 may be comprised of five NAND gates 1042a-1042e as shown in the right side of FIG. 7. The first bit PH_SEL[0] is NAND with the first reference clock signal Lo_ref_1, the second bit PH_SEL [1] is NAND with the second reference clock signal Lo_ref_2, the third bit PH_SEL[2] is NAND with the third reference clock signal Lo_ref_3, and the fourth bit PH_SEL[3] is NAND with the fourth reference clock signal Lo_ref_4. When the phase adjusting circuit 104 selects one of the first reference clock signal Lo_ref_1, the second reference clock signal Lo_ref_2, the third reference clock signal Lo_ref_3, and the fourth reference clock signal Lo_ref_4 to be the first adjusted clock signal LO_IP_MUX according to the selecting signal PH_SEL[3:0], the phase adjusting circuit 104 will orderly output the non-selected reference clock signals to be the second adjusted clock signal LO_QN_MUX, the third adjusted clock signal LO_IN_MUX, and the fourth adjusted clock signal LO_QP_MUX respectively. For example, if the selecting signal PH_SEL[3:0] selects the second reference clock signal Lo_ref_2 to be the leading-phase clock signal, then the first adjusted clock signal LO_IP_MUX is the second reference clock signal Lo_ref_2, the second adjusted clock signal LO_QN_MUX is the third reference clock signal Lo_ref_3, the third adjusted clock signal LO_IN_MUX is the fourth reference clock signal Lo_ref_4, and the fourth adjusted clock signal LO_QP_MUX is the first reference clock signal Lo_ref_1. It should be noted that the selecting signal PH_SEL[3:0] is adjusted according to frequencies of the first reference clock signal Lo_ref_1, the second reference clock signal Lo_ref_2, the third reference clock signal Lo_ref_3, and the fourth reference clock signal Lo_ref_4.

Figure 8:
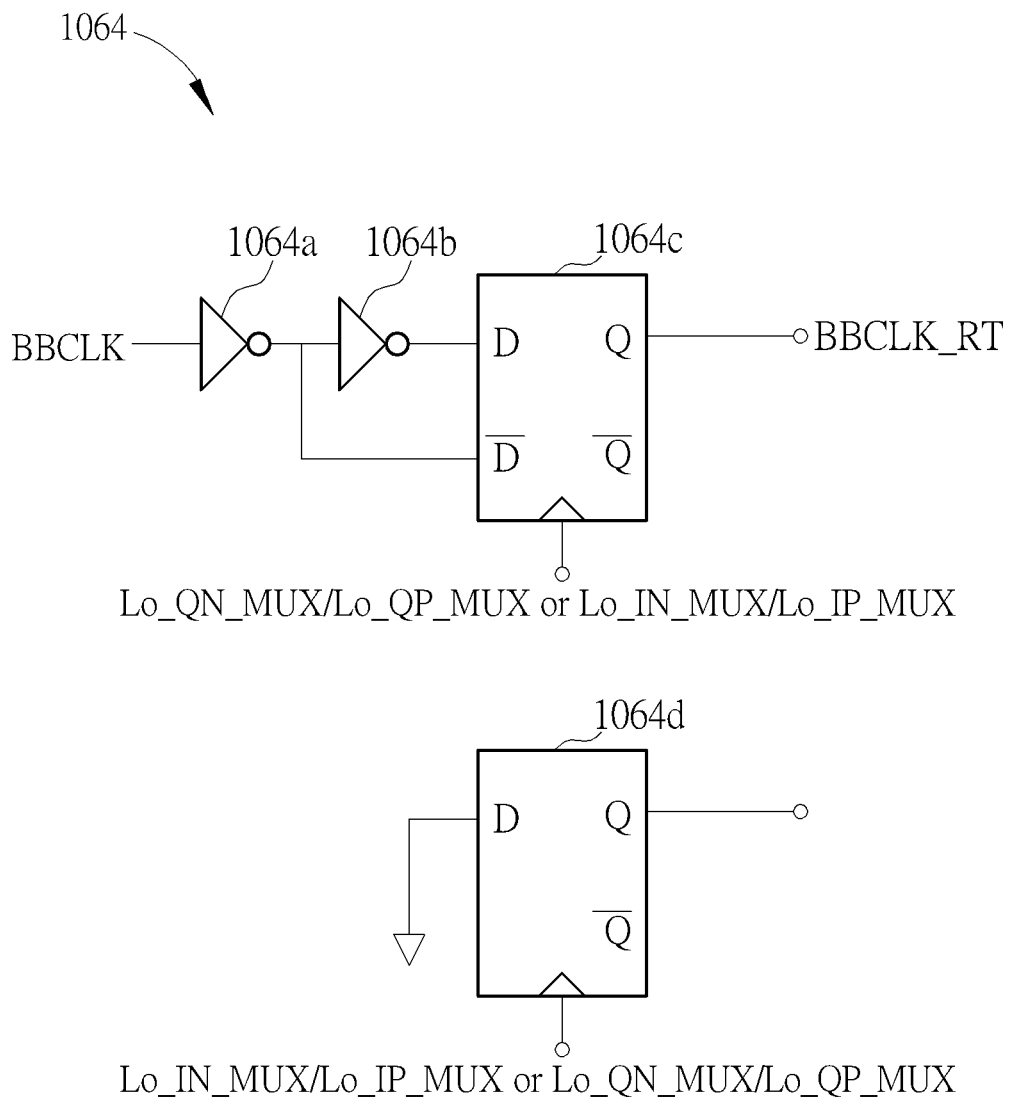
FIG. 8 is a diagram illustrating a retiming circuit of the digital signal up-converting apparatus according to an embodiment of the present invention.

Please refer to FIG. 8, which is a diagram illustrating the retiming circuit 1064 of the digital signal up-converting apparatus 100 according to an embodiment of the present invention. The retiming circuit 1064 comprises a first inverter 1064a, a second inverter 1064b, a first latch 1064c, and a second latch 1064d. The first latch 1064c is arranged to latch the baseband window clock BBCLK to generate the retime window clock BBCLK_RT by using one or two of the first adjusted clock signal LO_IP_MUX, the second adjusted clock signal LO_QN_MUX, the third adjusted clock signal LO_IN_MUX, and the fourth adjusted clock signal LO_QP_MUX. The second latch 1064d is a dummy latch for receiving the rest of the adjusted clock signal. For example, if the second adjusted clock signal LO_QN_MUX and the fourth adjusted clock signal LO_QP_MUX are used to control the first latch 1064c, then the first adjusted clock signal LO_IP_MUX and the third adjusted clock signal LO_IN_MUX are used to control the second latch 1064d.

Figure 9:
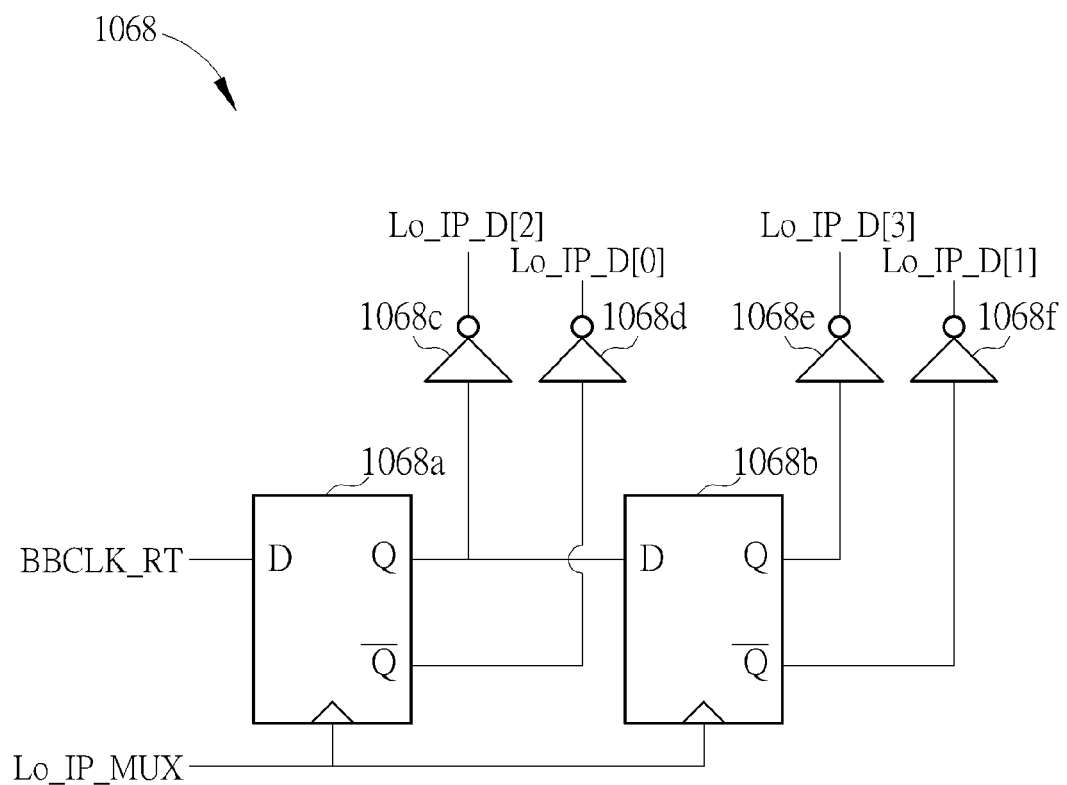
FIG. 9 is a diagram illustrating one window clock latching circuit according to an embodiment of the present invention.

Please refer to FIG. 9, which is a diagram illustrating one window clock latching circuit, e.g., the first window clock latching circuit 1068, according to an embodiment of the present invention. The first window clock latching circuit 1068 comprises a first latch 1068a, a second latch 1068b, and four inverters 1068c-1068f, and the connectivity is shown in FIG. 7. The first latch 1068a is arranged to latch the retime window clock BBCLK_RT to generate the first window clocks LO_IP_D[0] and LO_IP_D[2] by using the first adjusted clock signal LO_IP_MUX. The second latch 1068b is arranged to latch the first window clock LO_IP_D [2] to generate the first window clocks LO_IP_D[1] and LO_IP_D[3] by using the first adjusted clock signal LO_IP_MUX.

It is noted that the other window clock latching circuits 1070, 1072, 1074 are similar to the first window clock latching circuit 1068, thus the detailed description is omitted here for brevity.

Figure 10:
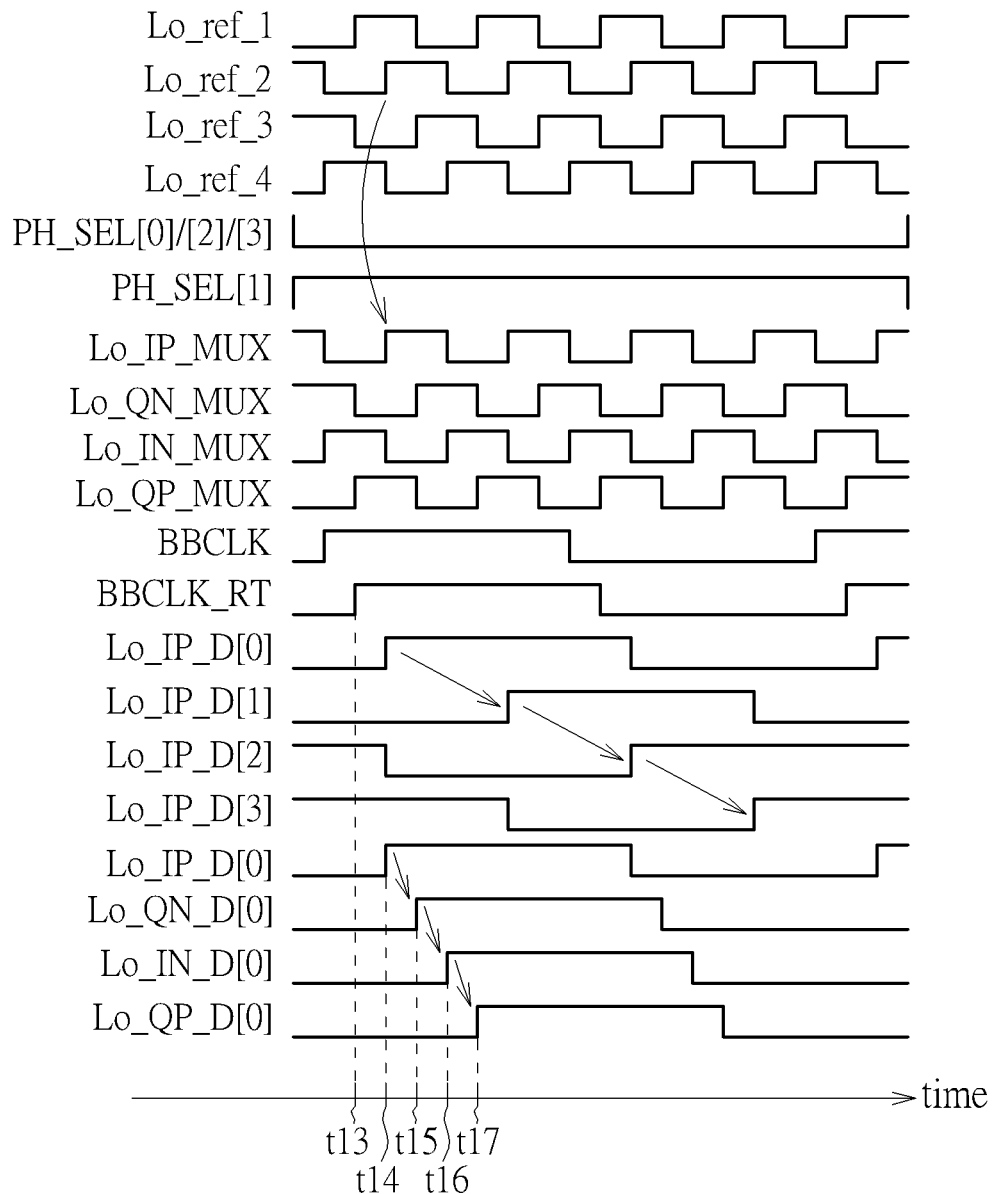
FIG. 10 is a timing diagram illustrating a first reference clock signal, a second reference clock signal, a third reference clock signal, a fourth reference clock signal, a plurality of selecting signals, a selecting signal, a first adjusted clock signal, a second adjusted clock signal, a third adjusted clock signal, a fourth adjusted clock signal, a baseband window clock, a retime window clock, a plurality of first window clocks, a first window clock, a second window clock, a third window clock, and a fourth window clock according to an embodiment of the present invention.

Please refer to FIG. 10, which is a timing diagram illustrating the first reference clock signal Lo_ref_1, the second reference clock signal Lo_ref_2, the third reference clock signal Lo_ref_3, the fourth reference clock signal Lo_ref_4, the selecting signals PH_SEL[0]/[2]/[3], the selecting signal PH_SEL [1], the first adjusted clock signal LO_IP_MUX, the second adjusted clock signal LO_QN_MUX, the third adjusted clock signal LO_IN_MUX, the fourth adjusted clock signal LO_QP_MUX, the baseband window clock BBCLK, the retime window clock BBCLK_RT, the plurality of first window clocks LO_IP_D[0]~LO_IP_D[3], the first window clock LO_IP_D[0], the second window clock LO_QN_D[0], the third window clock LO_IN_D[0], and the fourth window clock LO_QP_D[0] according to an embodiment of the present invention. In this example, the second reference clock signal Lo_ref_2 is selected to be the leading phase clock signal (i.e. the first adjusted clock signal LO_IP_MUX) by the selecting signal PH_SEL[1]. Then, the third reference clock signal Lo_ref_3, the fourth reference clock signal Lo_ref_4, and the first reference clock signal Lo_ref_1 are outputted to be the second adjusted clock signal LO_QN_MUX, the third adjusted clock signal LO_IN_MUX, the fourth adjusted clock signal LO_QP_MUX respectively.

At time t13, the fourth adjusted clock signal LO_QP_MUX is used to latch (i.e. re-time) the baseband window clock BBCLK to generate the retime window clock BBCLK_RT.

Then, at time t14, the first adjusted clock signal LO_IP_MUX is used to latch the retime window clock BBCLK_RT to generate four synchronized window clocks, i.e. the first window clock LO_IP_D[0], the second window clock LO_QN_D[0], the third window clock LO_IN_D[0], and the fourth window clock LO_QP_D[0]. Similarly, the second adjusted clock signal LO_QN_MUX is used to latch the retime window clock BBCLK_RT to generate the second window clock LO_QN_D[0] at time t15, the third adjusted clock signal LO_IN_MUX is used to latch the retime window clock BBCLK_RT to generate the third window clock LO_IN_D[0] at time t16, and the fourth adjusted clock signal LO_QP_MUX is used to latch the retime window clock BBCLK_RT to generate the fourth window clock LO_QP_D[0] at time t17.

Accordingly, the first window clock LO_IP_D[0] is aligned to the first adjusted clock signal LO_IP_MUX by using the first window clock latching circuit 1068. The second window clock LO_QN_D[0] is aligned to the second adjusted clock signal LO_QN_MUX by using the second window clock latching circuit 1070. The third window clock LO_IN_D[0] is aligned to the third adjusted clock signal LO_IN_MUX by using the third window clock latching circuit 1072. The fourth window clock LO_QP_D[0] is aligned to the fourth adjusted clock signal LO_QP_MUX by using the fourth window clock latching circuit 1074.

Figure 11:
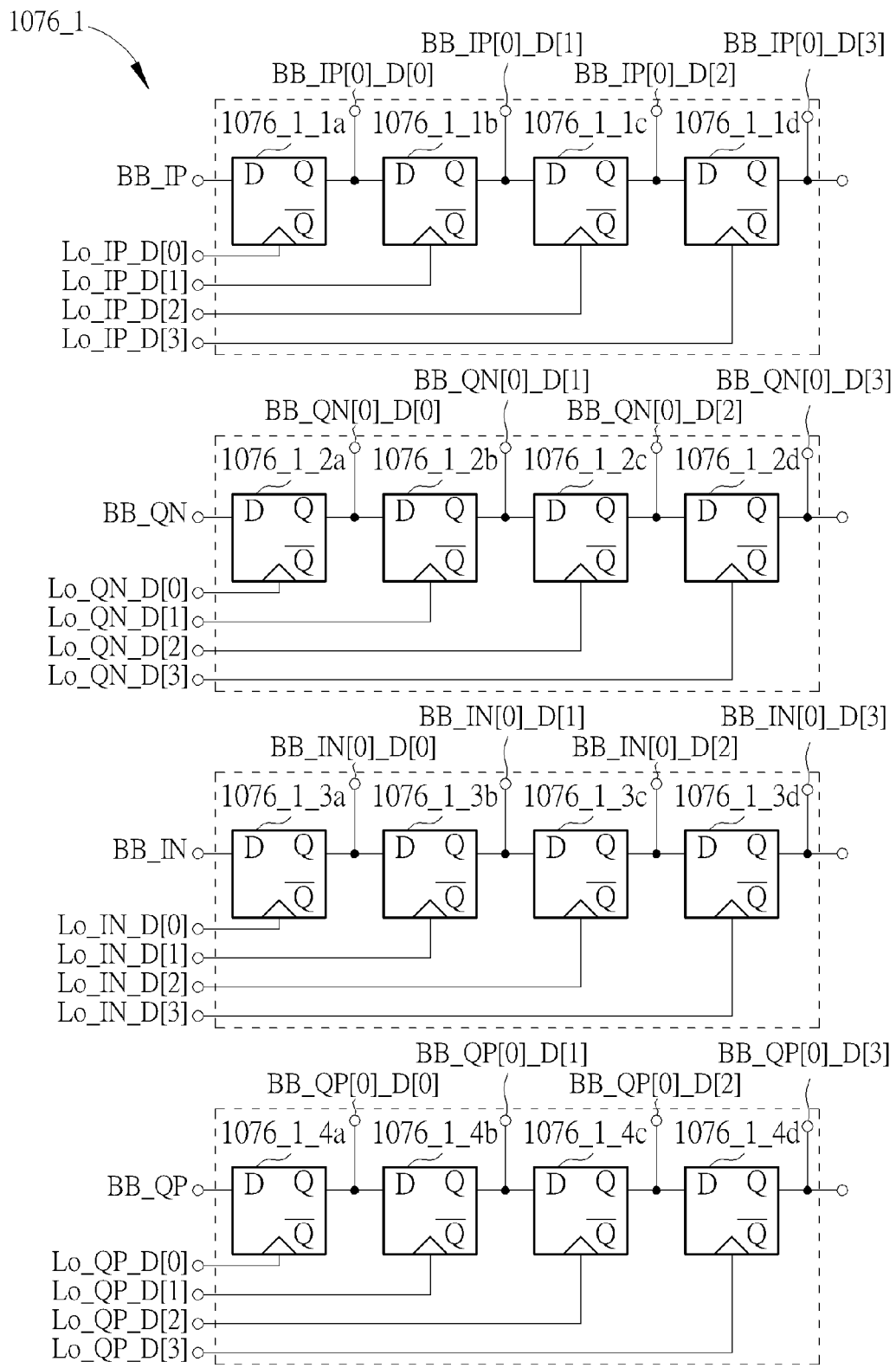
FIG. 11 is a diagram illustrating one latching circuit block according to an embodiment of the present invention.

Please refer to FIG. 11, which is a diagram illustrating one latching circuit block, e.g., the first latching circuit block 1076_1, according to an embodiment of the present invention. The first latching circuit block 1076_1 comprises the first data latching circuit 1076_1, the second data latching circuit 1076_1_2, the third data latching circuit 1076_1_3, and the fourth data latching circuit 1076_1_4. The first data latching circuit 1076_1_1 comprises four latches 1076_1_1a~1076_1_1d. The second data latching circuit 1076_1_2 comprises four latches 1076_1_2a-1076_1_2d. The third data latching circuit 1076_1_3 comprises four latches 1076_1_3a~1076_1_3d. The fourth data latching circuit 1076_1_4 comprises four latches 1076_1_4a~1076_1_4d.

The latch 1076_1_1a is arranged to latch the first bit BB_IP[0] to generate the first digital output signal BB_IP[0]_D[0] by using the first window clock LO_IP_D[0]. The latch 1076_1_1b is arranged to latch the first digital output signal BB_IP[0]_D[0] to generate the first digital output signal BB_IP[0]_D[1] by using the first window clock LO_IP_D[1]. The latch 1076_1_1c is arranged to latch the first digital output signal BB_IP[0]_D[1] to generate the first digital output signal BB_IP[0]_D[2] by using the first window clock LO_IP_D[2]. The latch 1076_1_1d is arranged to latch the first digital output signal BB_IP[0]_D[2] to generate the first digital output signal BB_IP[0]_D[3] by using the first window clock LO_IP_D[3].

The latch 1076_1_2a is arranged to latch the second bit BB_QN[0] to generate the second digital output signal BB_QN[0]_D[0] by using the second window clock LO_QN_D[0]. The latch 1076_1_2b is arranged to latch the second digital output signal BB_QN[0]_D[0] to generate the second digital output signal BB_QN[0]_D[1] by using the second window clock LO_QN_D[1]. The latch 1076_1_2c is arranged to latch the second digital output signal BB_QN[0]_D[1] to generate the second digital output signal BB_QN[0]_D[2] by using the second window clock LO_QN_D[2]. The latch 1076_1_2d is arranged to latch the second digital output signal BB_QN[0]_D[2] to generate the second digital output signal BB_QN[0]_D[3] by using the second window clock LO_QN_D[3].

The latch 1076_1_3a is arranged to latch the third bit BB_IN[0] to generate the third digital output signal BB_IN[0]_D[0] by using the third window clock LO_IN_D[0]. The latch 1076_1_3b is arranged to latch the third digital output signal BB_IN[0]_D[0] to generate the third digital output signal BB_IN[0]_D[1] by using the third window clock LO_IN_D[1]. The latch 1076_1_3c is arranged to latch the third digital output signal BB_IN[0]_D[1] to generate the third digital output signal BB_IN[0]_D[2] by using the third window clock LO_IN_D[2]. The latch 1076_1_3d is arranged to latch the third digital output signal BB_IN[0]_D[2] to generate the third digital output signal BB_IN[0]_D[3] by using the third window clock LO_IN_D[3].

The latch 1076_1_4a is arranged to latch the fourth bit BB_QP[0] to generate the fourth digital output signal BB_QP[0]_D[0] by using the fourth window clock LO_QP_D[0]. The latch 1076_1_4b is arranged to latch the fourth digital output signal BB_QP[0]_D[0] to generate the fourth digital output signal BB_QP[0]_D[1] by using the fourth window clock LO_QP_D[1]. The latch 1076_1_4c is arranged to latch the fourth digital output signal BB_QP[0]_D[1] to generate the fourth digital output signal BB_QP[0]_D[2] by using the fourth window clock LO_QP_D[2]. The latch 1076_1_4d is arranged to latch the fourth digital output signal BB_QP[0]_D[2] to generate the fourth digital output signal BB_QP[0]_D[3] by using the fourth window clock LO_QP_D[3].

It is noted that configuration of the other latching circuit blocks 1076_2~1076_n are similar to the configuration of the first latching circuit block 1076_1. Therefore, the detailed description is omitted here for brevity.

Figure 12:
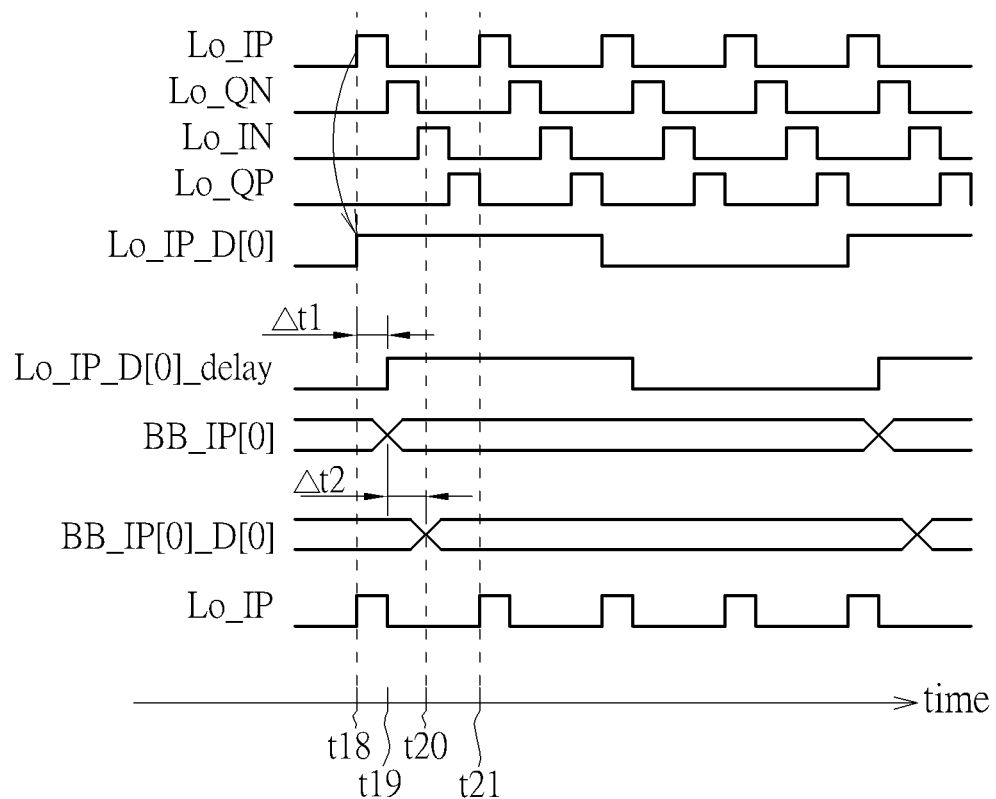
FIG. 12 is a timing diagram illustrating a first sampling clock signal, a second sampling clock signal, a third sampling clock signal, a fourth sampling clock signal, a first window clock, a delayed-first window clocks, a first bit of digital data, and a first digital output signal according to an embodiment of the present invention.

An example is shown in FIG. 12. FIG. 12 is a timing diagram illustrating the first sampling clock signal LO_IP, the second sampling clock signal LO_QN, the third sampling clock signal LO_IN, the fourth sampling clock signal LO_QP, the first window clock LO_IP_D[0], a delayed-first window clocks LO_IP_D[0] delay, the first bit of digital data BB_IP[0], and the first digital output signal BB_IP[0]_D[0] according to an embodiment of the present invention. In FIG. 12, the first sampling clock signal LO_IP is aligned with the first window clock LO_IP_D[0] at time t18. However, when the first window clock LO_IP_D[0] reaches the first data latching circuit 1076_1_1 (or any other data latching circuit 1076_n_1), the first window clock LO_IP_D[0] may be delayed by a trace delay $\Delta t1$ to be the delayed-first window clocks LO_IP_D[0] delay. Then, at time t19, the delayed-first window clocks LO_IP_D[0] delay latches the first bit of digital data BB_IP[0] to generate the first digital output signal BB_IP[0]_D[0]. After another trace delay Δt2, the first digital output signal BB_IP[0]_D[0] reaches the first pass gate 108_1_1 at time t20. Then, the first sampling clock signal LO_IP samples the first digital output signal BB_IP[0]_D[0] at time t21.

According to the operation of the first data latching circuit 1076_1_1 and the first pass gate 108_1_1 as shown in FIG. 12, the first sampling clock signal LO_IP may not sample the data edge (i.e. the voltage switching edge) of the first digital output signal BB_IP[0]_D[0]. Similarly, the other sampling clock signals LO_QN, LO_IN, LO_QP may also not sample the data edges (i.e. the voltage switching edge) of the other digital output signal BB_QN[0]_D[0], BB_IN[0]_D[0], BB_QP[0]_D[0] respectively. The detailed operation is omitted here for brevity.

Figure 13:
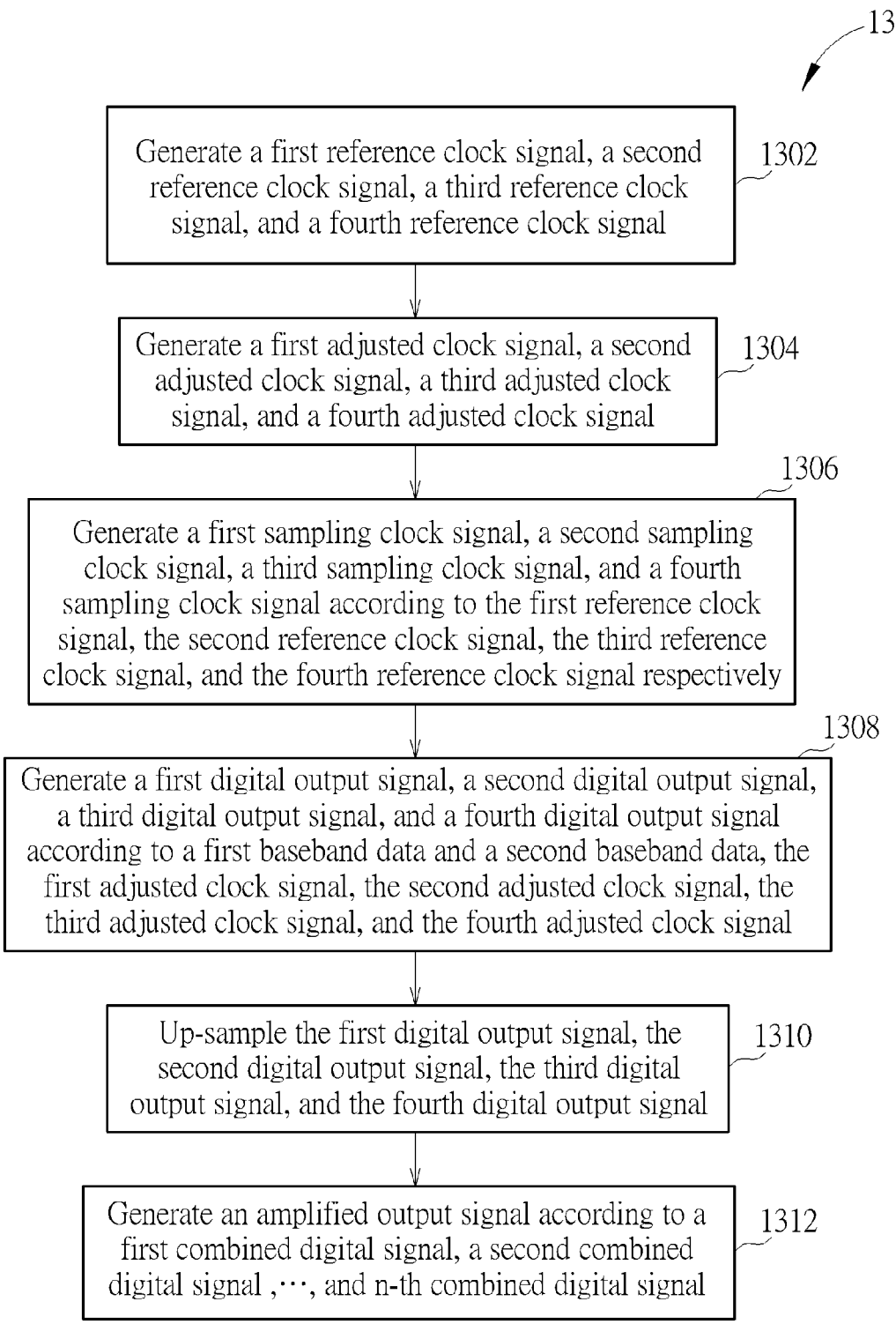
FIG. 13 is a flowchart illustrating a digital signal up-converting method of the digital signal up-converting apparatus according to an embodiment of the present invention.

In summary, the method of the above mentioned the digital signal up-converting apparatus 100 can be summarized into the steps of FIG. 13. FIG. 13 is a flowchart illustrating a digital signal up-converting method 1300 of the digital signal up-converting apparatus 100 according to an embodiment of the present invention. Provided that substantially the same result is achieved, the steps of the flowchart shown in FIG. 13 need not be in the exact order shown and need not be contiguous, that is, other steps can be intermediate. The digital signal up-converting method 1300 comprises:

Step 1302: Generate the first reference clock signal Lo_ref_1, the second reference clock signal Lo_ref_2, the third reference clock signal Lo_ref_3, and the fourth reference clock signal Lo_ref_4;

Step 1304: Adjusting the first reference clock signal Lo_ref_1, the second reference clock signal Lo_ref_2, the third reference clock signal Lo_ref_3, and the fourth reference clock signal Lo_ref_4 to generate the first adjusted clock signal LO_IP_MUX, the second adjusted clock signal LO_QN_MUX, the third adjusted clock signal LO_IN_MUX, and the fourth adjusted clock signal LO_QP_MUX;

Step 1306: Generate the first sampling clock signal LO_IP, the second sampling clock signal LO_QN, the third sampling clock signal LO_IN, and the fourth sampling clock signal LO_QP according to the first reference clock signal L Lo_ref_1, the second reference clock signal Lo_ref_2, the third reference clock signal Lo_ref_3, and the fourth reference clock signal Lo_ref_4 respectively;

Step 1308: Generate the first digital output signal BB_IP[0]_D[0], the second digital output signal BB_QN[0]_D[0], the third digital output signal BB_IN[0]_D[0], and the fourth digital output signal BB_QP[0]_D[0] according to the first baseband data BB_I[0]~BB_I[n], the second baseband data BB_Q[0]~BB_Q[n], the first adjusted clock signal LO_IP_MUX, the second adjusted clock signal LO_QN_MUX, the third adjusted clock signal LO_IN_MUX, and the fourth adjusted clock signal LO_QP_MUX;

Step 1310: Up-sample the first digital output signal BB_IP[0]_D[0], the second digital output signal BB_QN[0]_D[0], the third digital output signal BB_IN[0]_D[0], and the fourth digital output signal BB_QP[0]_D[0] to generate the first combined digital signal IPS[0]+QNS[0]+INS[0]+QPS[0], the second combined digital signal IPS[1]+QNS[1]+INS[1]+QPS[1], . . . , the n-th combined digital signal IPS[n]+QNS[n]+INS[n]+QPS[n] according to the first sampling clock signal LO_IP, the second sampling clock signal LO_QN, the third sampling clock signal LO_IN, and the fourth sampling clock signal LO_QP; and Step 1312: Generate the amplified output signal Out[0]~Out[n] according to the first combined digital signal IPS[0]+QNS[0]+INS[0]+QPS[0], the second combined digital signal IPS[1]+QNS[1]+INS[1]+QPS[1], . . . , the n-th combined digital signal IPS[n]+QNS[n]+INS[n]+QPS[n].

Accordingly, the digital signal up-converting apparatus 100 has the following advantages: 1) The efficiency of the digital signal up-converting apparatus 100 is almost the same as the conventional polar-base transmitter due to the reason of no power loss in quadrature up converter processing mechanism. 2) Data forming at differential gates of the switch PA id defined and no power loss would be induced by differential devices turning on simultaneously. 3) The signal connection at RF drain output is simple because only one digital PA is needed. 4) By using the pass-gates to sample the baseband quadrature data of the digital quadrature converter (DQC), there has no pull-down device to insensitive the LO duty variation. 5) The current consumption of the pass-gates is low. 6) The synchronized non-overlapping between data and LO edges eliminates spurs.

Briefly speaking, according to the above description about the digital signal up-converting apparatus 100, the baseband quadrature data (i.e. BB_IP[0]_D[0]~BB_IP[n]_D[0], BB_QN[0]_D[0]~BB_QN[n]_D[0], BB_IN[0]_D[0]~BB_IN[n]_D[0], and BB_QP[0]_D[0]~BB_QP[n]_D[0]) is sampled by the clock (i.e. LO_IP, LO_QN, LO_IN, and LO_QP) which generated by a local oscillator (i.e. Lo_ref_1, Lo_ref_2, Lo_ref_3, and Lo_ref_4). The baseband data timing is delayed (i.e. via 1068, 1070, 1072, 1074), re-synchronized and latched (i.e. via 1046_1~1076_*n*) by LO (local oscillation) clock (i.e. LO_IP_MUX, LO_QN_MUX, LO_IN_MUX, and LO_QP_MUX) to well define the non-overlapped BB and LO edges to prevent the LO edge aligned to the BB data edge. The LO (i.e. LO_IP, LO_QN, LO_IN, and LO_QP) samples the synchronized quadrature data (i.e. BB_IP[0]_D[0]~BB_IP[n]_D[0], BB_QN[0]_D[0]~BB_QN[n]_D[0], BB_IN[0]_D[0]~BB_IN[n]_D[0], and BB_QP[0]_D[0]~BB_QP[n]_D[0]) by pass-gate (i.e. 108) sequentially, and then up-converts and adds up (i.e. 108) the I+jQ data in time domain. One switch amplifier (i.e. 110_1) is followed by the pass-gate (i.e. 108_1) to amplify the signal (i.e. IPS[0]+QNS[0]+INS[0]+QPS[0]) digitally. When the positive side at gate of the switch PA has data, the negative side will definitely present zero input. Therefore, no power loss would be induced by differential devices turning on simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital signal up-converting apparatus, comprising:
   a clock generating circuit, arranged to generate a reference clock signal;
   an adjusting circuit, coupled to the clock generating circuit, arranged to generate a first clock signal and a plurality of second clock signals according to the reference clock signal;
   a baseband circuit, coupled to the adjusting circuit, for receiving the first clock signal, wherein the baseband circuit further generates a digital output signal according to the first clock signal; and
   a sampling circuit, coupled to the adjusting circuit and the baseband circuit, for receiving the plurality of second clock signals and the digital output signal, wherein the plurality of second clock signals are non-overlapping;
   wherein the sampling circuit samples the digital output signal based on at least one of the plurality of second clock signals and then combines the sampled digital output signal in order to generate a combined digital signal; and the first clock signal is a phase-adjusted clock signal of the reference clock signal and the at least one of the plurality of second clock signals is a duty cycle-adjusted clock signal of the reference clock signal, wherein the duty cycle-adjusted clock signal is between 0% and 100%, non-inclusive.

2. The digital signal up-converting apparatus of claim 1, further comprising:
   an amplifier, arranged to generate an amplified output signal according to the combined digital signal.

3. The digital signal up-converting apparatus of claim 1, wherein the adjusting circuit comprises:
   a phase adjusting circuit, arranged to adjust a phase of the reference clock signal to generate the first clock signal; and
   a duty cycle adjusting circuit, arranged to adjust a duty cycle of the reference clock signal to generate the plurality of second clock signals.

4. The digital signal up-converting apparatus of claim 1, wherein the baseband circuit is arranged to delay a baseband data to generate the digital output signal according to the first clock signal.

5. The digital signal up-converting apparatus of claim 1, wherein signal edges of the plurality of second clock signals are non-overlapping.

6. A digital signal up-converting apparatus, comprising:
   a clock generating circuit, arranged to generate a reference clock signal;
   an adjusting circuit, coupled to the clock generating circuit, arranged to generate a first clock signal and a plurality of second clock signals according to the reference clock signal, wherein the adjusting circuit comprises:
      a phase adjusting circuit, arranged to adjust a phase of the reference clock signal to generate the first clock signal; and
      a duty cycle adjusting circuit, arranged to adjust a duty cycle of the reference clock signal to generate the plurality of second clock signals;
   a baseband circuit, coupled to the adjusting circuit, for receiving the first clock signal, wherein the baseband circuit further generates a digital output signal according to the first clock signal; and
   a sampling circuit, coupled to the adjusting circuit and the baseband circuit, for receiving the plurality of second clock signals and the digital output signal, wherein the plurality of second clock signals are non-overlapping;
   wherein the sampling circuit samples the digital output signal based on the plurality of second clock signals and then combines the sampled digital output signal in order to generate a combined digital signal.

7. The digital signal up-converting apparatus of claim 6, further comprising:
   an amplifier, arranged to generate an amplified output signal according to the combined digital signal.

8. The digital signal up-converting apparatus of claim 6, wherein the baseband circuit is arranged to delay a baseband data to generate the digital output signal according to the first clock signal.

9. The digital signal up-converting apparatus of claim 6, wherein signal edges of the plurality of second clock signals are non-overlapping.

* * * * *